United States Patent
Bai et al.

(10) Patent No.: US 10,988,598 B2
(45) Date of Patent: Apr. 27, 2021

(54) HIGH REFRACTIVE INDEX SOLVENT FREE SILICONE NANOCOMPOSITES

(71) Applicant: PIXELLIGENT TECHNOLOGIES LLC, Baltimore, MD (US)

(72) Inventors: Xia Bai, Olney, MD (US); Wei Xu, Basking Ridge, NJ (US); Linfeng Gou, Chesterbrook, PA (US); Robert Wiacek, Silver Spring, MD (US); Selina Monickam, Takoma Park, MD (US); Brian Wehrenberg, Baltimore, MD (US); Amy Stabell, Baltimore, MD (US); Maneesh Bahadur, Midland, MI (US); Serpil Gonen Williams, Lanham, MD (US)

(73) Assignee: PIXELLIGENT TECHNOLOGIES, LLC, Baltimore, MD (US)

( * ) Notice: Subject to any disclaimer, the term of this patent is extended or adjusted under 35 U.S.C. 154(b) by 0 days.

(21) Appl. No.: 15/562,638

(22) PCT Filed: Mar. 29, 2016

(86) PCT No.: PCT/US2016/024717
§ 371 (c)(1),
(2) Date: Sep. 28, 2017

(87) PCT Pub. No.: WO2016/160806
PCT Pub. Date: Oct. 6, 2016

(65) Prior Publication Data
US 2018/0112069 A1    Apr. 26, 2018

Related U.S. Application Data

(60) Provisional application No. 62/140,352, filed on Mar. 30, 2015, provisional application No. 62/169,332, filed on Jun. 1, 2015.

(51) Int. Cl.
| | |
|---|---|
| *C08K 9/06* | (2006.01) |
| *C08L 83/04* | (2006.01) |
| *C08K 9/08* | (2006.01) |
| *H01L 33/56* | (2010.01) |
| *H01L 33/58* | (2010.01) |
| *C08K 3/22* | (2006.01) |

(52) U.S. Cl.
CPC ............. *C08K 9/06* (2013.01); *C08K 9/08* (2013.01); *C08L 83/04* (2013.01); *H01L 33/56* (2013.01); *H01L 33/58* (2013.01); *C08K 2003/2244* (2013.01); *C08K 2201/011* (2013.01); *C08K 2201/019* (2013.01); *H01L 2933/005* (2013.01)

(58) Field of Classification Search
CPC ..... C08K 9/06; C08K 2201/019; C08L 83/04; H01L 2933/005; H01L 33/58; H01L 33/56
USPC ........................................................ 524/261
See application file for complete search history.

(56) References Cited

U.S. PATENT DOCUMENTS

| | | |
|---|---|---|
| 2002/0004544 A1 | 1/2002 | Kolb et al. |
| 2009/0121180 A1 | 5/2009 | Tsubokawa et al. |
| 2009/0233090 A1 | 9/2009 | Wong et al. |
| 2012/0088845 A1 | 4/2012 | Gonen Williams et al. |
| 2013/0256742 A1 | 10/2013 | Harkness et al. |
| 2015/0021643 A1 | 1/2015 | Kurino et al. |
| 2015/0054425 A1* | 2/2015 | Guschl ................ C08G 77/38 315/294 |
| 2015/0380688 A1* | 12/2015 | Chen ................ H01L 51/5275 257/40 |

FOREIGN PATENT DOCUMENTS

| | | | |
|---|---|---|---|
| JP | 2009-120437 | | 6/2009 |
| JP | 2014-505748 | | 3/2014 |
| JP | 2014-077092 | | 5/2014 |
| JP | 2014077092 | * | 5/2014 |
| WO | WO 2007/043496 | | 4/2007 |
| WO | WO 2013/133430 | | 9/2013 |
| WO | WO 2015/069384 | | 5/2014 |
| WO | WO 2015/006276 | | 1/2015 |
| WO | WO 2015/069384 | | 5/2015 |

OTHER PUBLICATIONS

International Search Report for PCT/US2016/024717, dated Jul. 25, 2016, 4 pages.
Written Opinion of the ISA for PCT/US2016/024717, dated Jul. 25, 2016, 14 pages.
Liu et al, *High Refractive Index and Transparent Nanocomposites as Encapsulant for High Brightness LED Packaging*, IEEE Transactions on Components, Packaging and Manufacturing Technology, vol. 4, No. 7, Jul. 2014.

* cited by examiner

*Primary Examiner* — Hui H Chin
(74) *Attorney, Agent, or Firm* — Nixon & Vanderhye P.C.

(57) ABSTRACT

At least partially capped nanocrystals and nanocomposites containing the nanocrystals are described herein along with products, uses and methods of making.

15 Claims, 22 Drawing Sheets

-H
-CH=CH$_2$
-CH$_2$-CH=CH$_2$
-O-Si(CH$_3$)$_2$-H
-O-Si(CH$_3$)$_2$-CH=CH$_2$

HIGH REFRACTIVE INDEX SOLVENT FREE SILICONE NANOCOMPOSITES

This application is the U.S. national phase of International Application No. PCT/US2016/024717 filed Mar. 29, 2016, which designated the U.S. and claims the benefit of U.S. Provisional Application No. 62/140,352, filed Mar. 30, 2015 and U.S. Provisional Application No. 62/169,332, filed Jun. 1, 2015, the entire contents of each of which are hereby incorporated herein by reference.

The present application claims benefit of U.S. Provisional Application No. 62/140,352, filed Mar. 30, 2015 and U.S. Provisional Application No. 62/169,332, filed Jun. 1, 2015, the entire contents of each of which are incorporated herein by reference.

The silicone material family has a unique combination of properties: they are optically transparent from infra-red (IR) to visible to ultra-violet (UV) spectrum; they are thermally stable; and their low viscosity makes them suitable for a variety of processing techniques. This unique combination of properties is desirable for many electronic and optical applications such as high brightness light emitting diodes (HB-LED), organic light emitting diodes (OLED), solar cells, lasers etc.

Silicones typically have refractive index less than 1.6, and in many cases less than 1.55. For many of the above mentioned applications, high refractive index is desired to couple light in and out of the device more efficiently. For example, in an HB-LED the mismatch of the refractive index of the active materials, which is ~2.6, and that of the silicone encapsulant, results in some emitted light being trapped inside the chip and reduces overall efficiency of the device. Improving the refractive index of the silicone materials while preserving other properties is critical to many applications.

Inorganic materials, such as metal oxides, typically have higher refractive indices than most polymers. However these materials are generally rigid and difficult to process. By combining nanocrystals of these materials with a silicone matrix it is possible to create nanocomposites that possess high refractive index, high clarity, and maintain the thermal stability, processability, and mechanic properties of the silicone materials.

Nanocrystals and Capped Nanocrystals

In a non-limiting example, the present disclosure provides, among other things, processes for capping nanocrystals; processes for making nanocrystal dispersions in silicone that are substantially solvent-free; processes for thermally curing nanocrystal dispersions in silicones to make silicone nanocomposites; and processes for making cured silicone nanocomposite films, devices and structures. The nanocrystals may comprise metal oxides selected from zirconium oxide, titanium oxide, hafnium oxide, zinc oxide, yttrium oxide, and niobium oxide and/or mixtures of at least two of these and/or alloys of at least two thereof.

There is a need to have nanocrystal dispersions in silicones that can be processed without the use of organic solvents, i.e. 100% solid dispersion with no volatile organic solvents, as well as a need for nanocrystal dispersion with very low volatile organic solvent content such as ≤5 weight percent of organic solvents, or 0 to 1 weight percent of organic solvents, or 1 to 2 weight percent of organic solvents, or 2 to 3 weight percent of organic solvents, or 3 to 4 weight percent of organic solvents, or 4 to 5 weight percent of organic solvents. In this patent we will refer to these dispersions as solvent-free dispersions. These nanocrystal dispersions in silicones allow for the creation of thermally cured silicone nanocomposites that have enhanced optical properties such as simultaneously having high refractive index and high optical clarity.

Many metal oxides have high bulk refractive indexes, typically higher than 1.9 in the visible spectrum, as well as exceptional transparency. Nanocrystals have diameters much smaller than the wavelength of the actinic light, or smaller than one tenth of the actinic wavelength, to minimize light scattering. The potential incompatibility between the inorganic nanoparticles and silicone polymers may lead to agglomeration, which can cause reduced shelf life, reduced mechanical properties, and a loss in the optical transparency that severely limits their use in optical applications. Capping agents are used to improve the compatibility of the nanocrystals with the matrix. Capping agents may also be referred to as capping ligands or capping groups. These capping agents can be attached to the surface of the nanocrystals (either as a single kind of capping agent or multiple kinds of capping agents) to make capped nanocrystals that have the desired properties when dispersed into silicone monomers, polymers, or mixtures thereof. The capped nanocrystals can be dispersed either directly or with the aid of a solvent followed by solvent removal/flash-off to provide a substantially solvent-free silicone dispersion. The capped nanocrystals can also be dispersed into solvent containing dispersions where the solvent is removed, either immediately before curing or as the material cures to form silicone nanocomposites.

| Wavelength (nm) | Optical Density |
| --- | --- |
| 350 | 0.210 |
| 400 | 0.065 |
| 450 | 0.034 |
| 500 | 0.022 |
| 550 | 0.015 |
| 600 | 0.012 |
| 650 | 0.010 |

Figure 13:
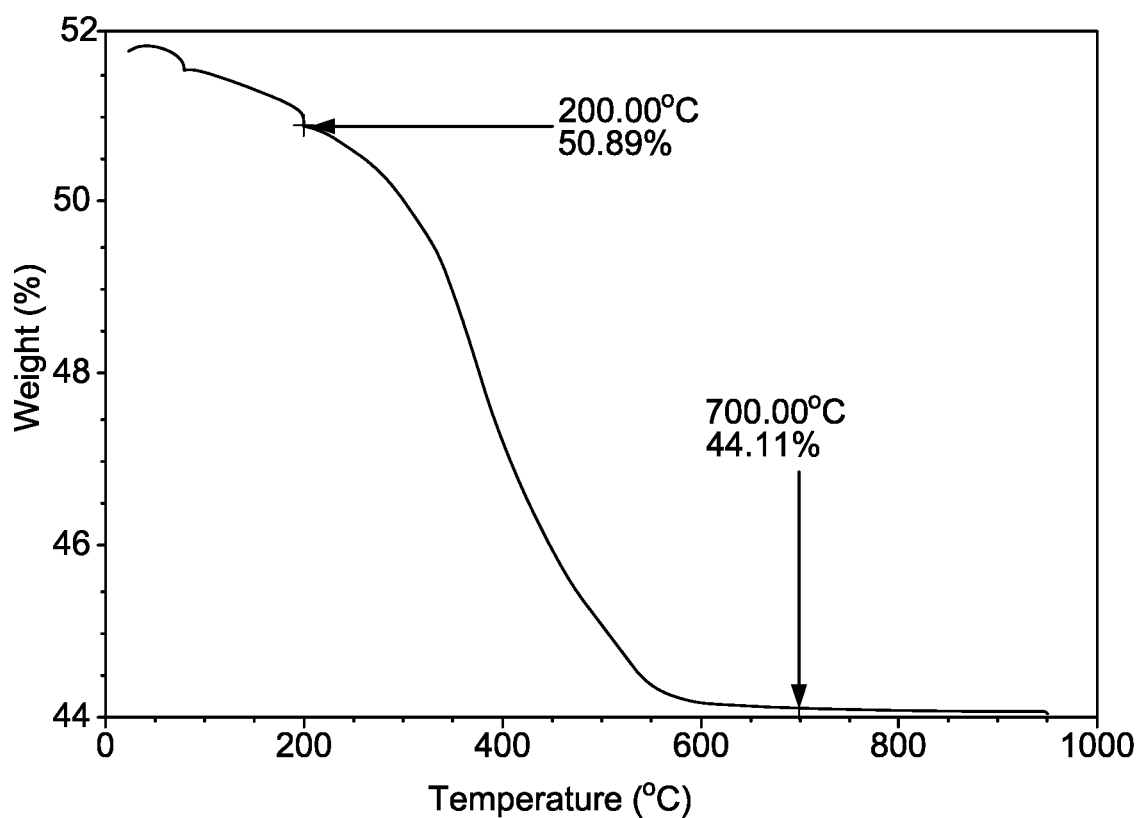

FIG. 13. Thermal gravimetric analysis of the capped zirconia dispersion in at 50 wt % in heptane. The calculated percent organic is as follows: % Mass at 200 C=50.89; % Mass at 700 C=44.11% and % Organics (% @200 C−700 C) % @700 C) % @200 C)=13.32%.

Figure 14:
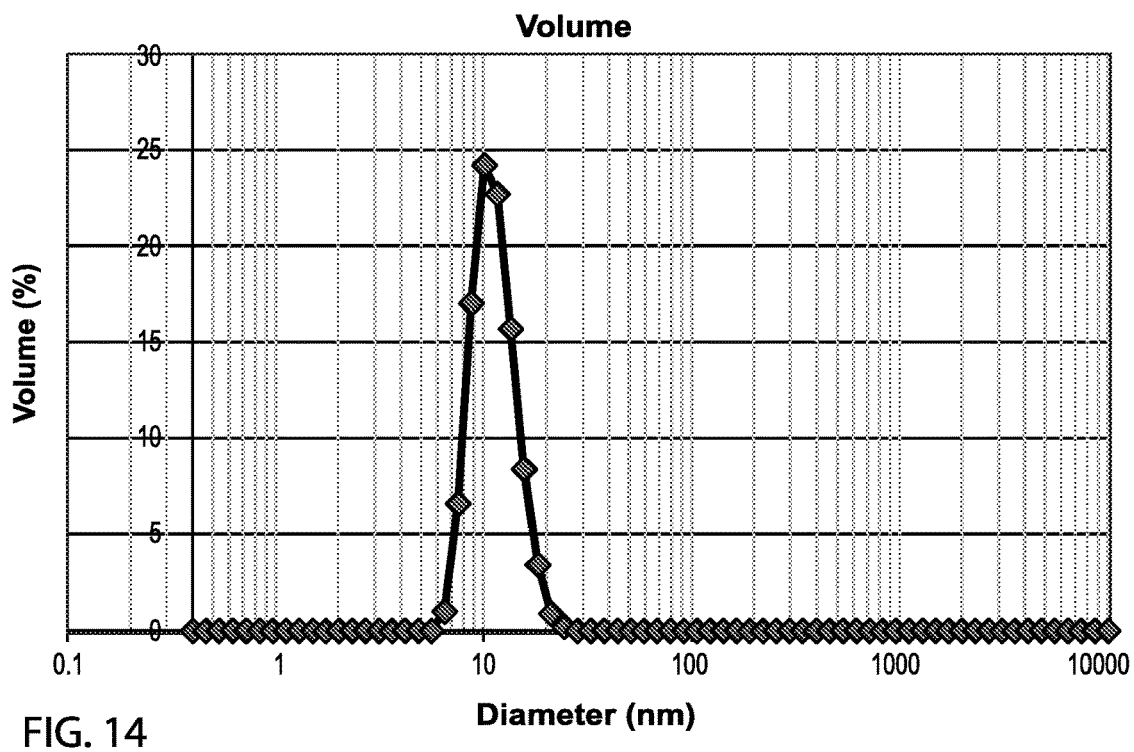

FIG. 14. Size distribution of the capped zirconia nanocrystal in heptane measured with dynamic light scattering instrument. The calculated values are peak mean diameter (vol)=11 nm, peak-1 diameter (int)=13 nm and $d_v$ (99.99)=28 nm.

Figure 15:
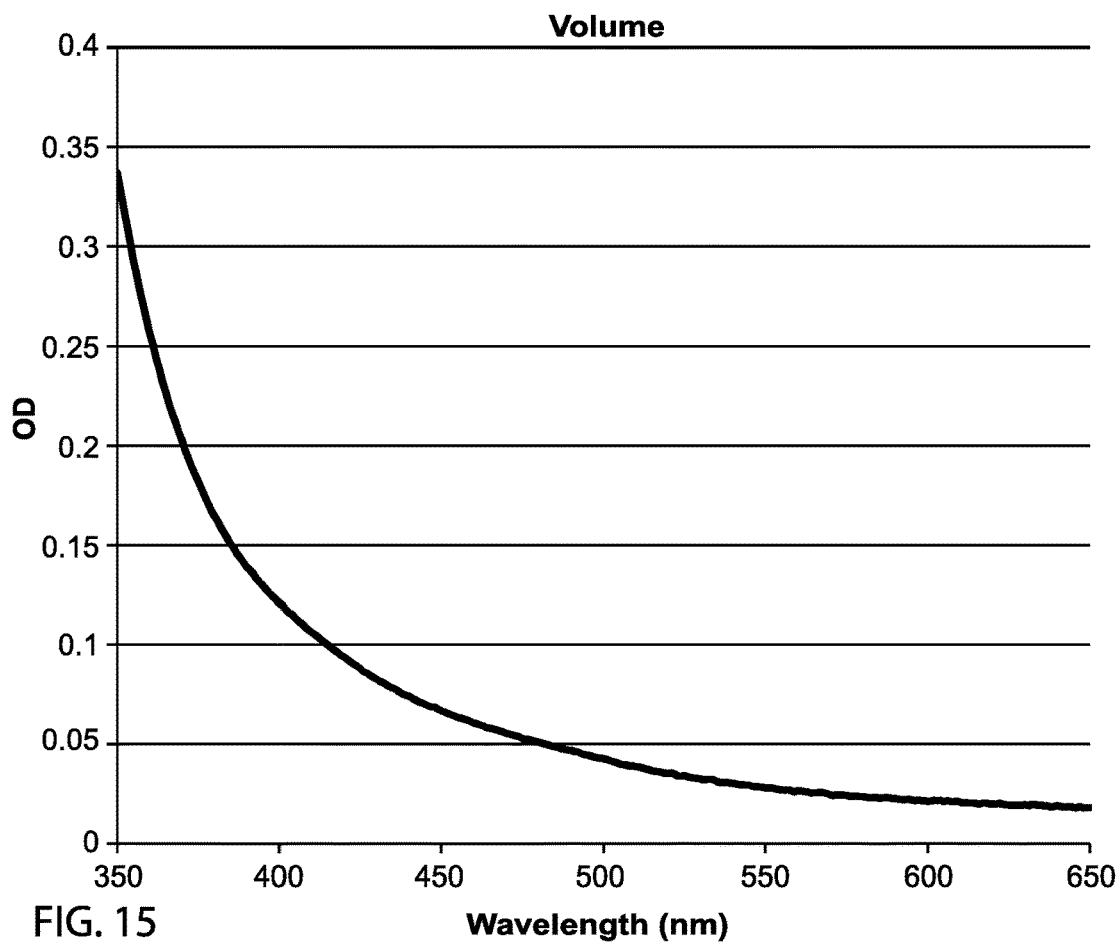

FIG. 15. Uv-vis spectrum of the dispersion of the capped zirconia in xylenes at 50 wt % loading FIG. 16. Thermal gravimetric analysis of the dispersion of the capped zirconia in xylenes at 50 wt % loading. The calculated percent organic is as follows: % Mass at 200 C=50.73; % Mass at 700 C=45.64% and % Organics (% @200 C−% @700 C) % @200 C)=10.03%.

Figure 17:
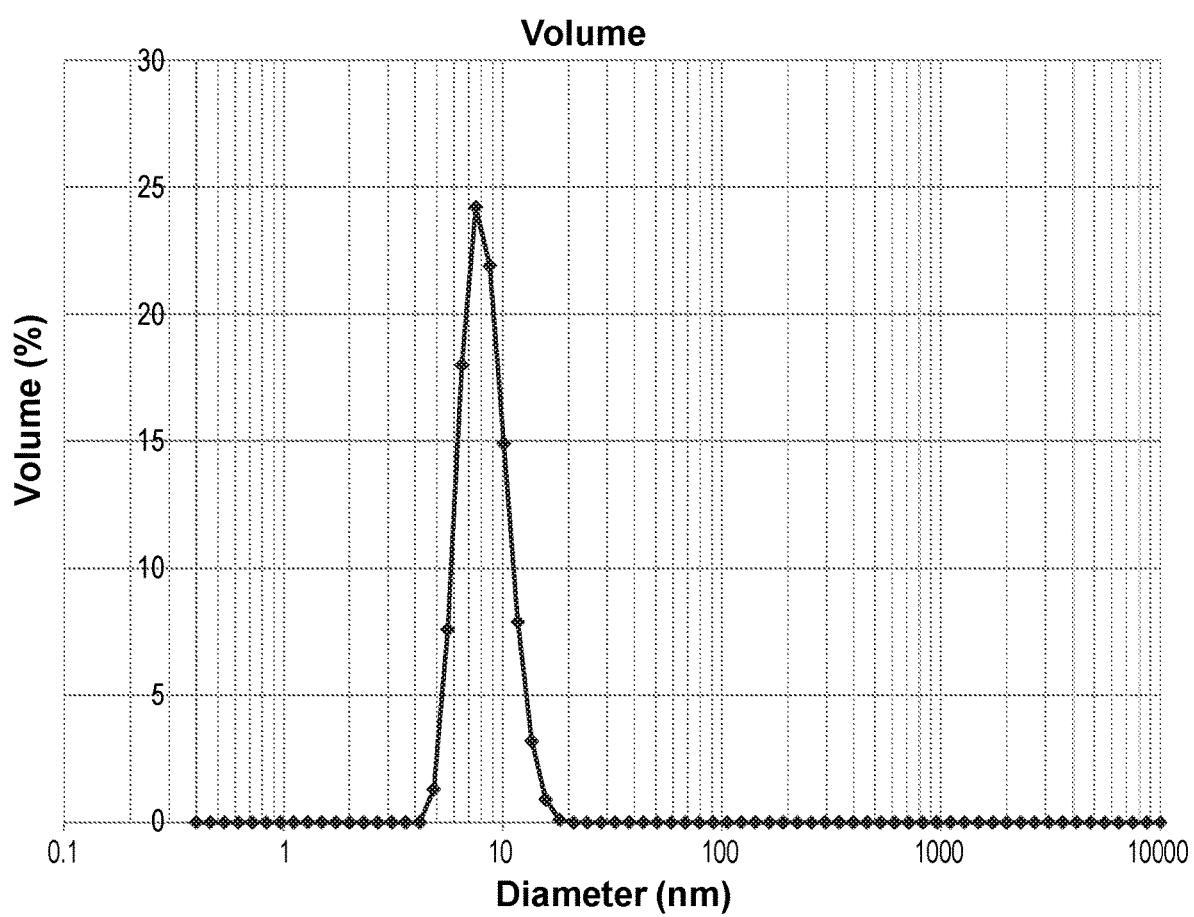

FIG. 17. Size distribution of the capped zirconia nanocrystal

Figure 18:
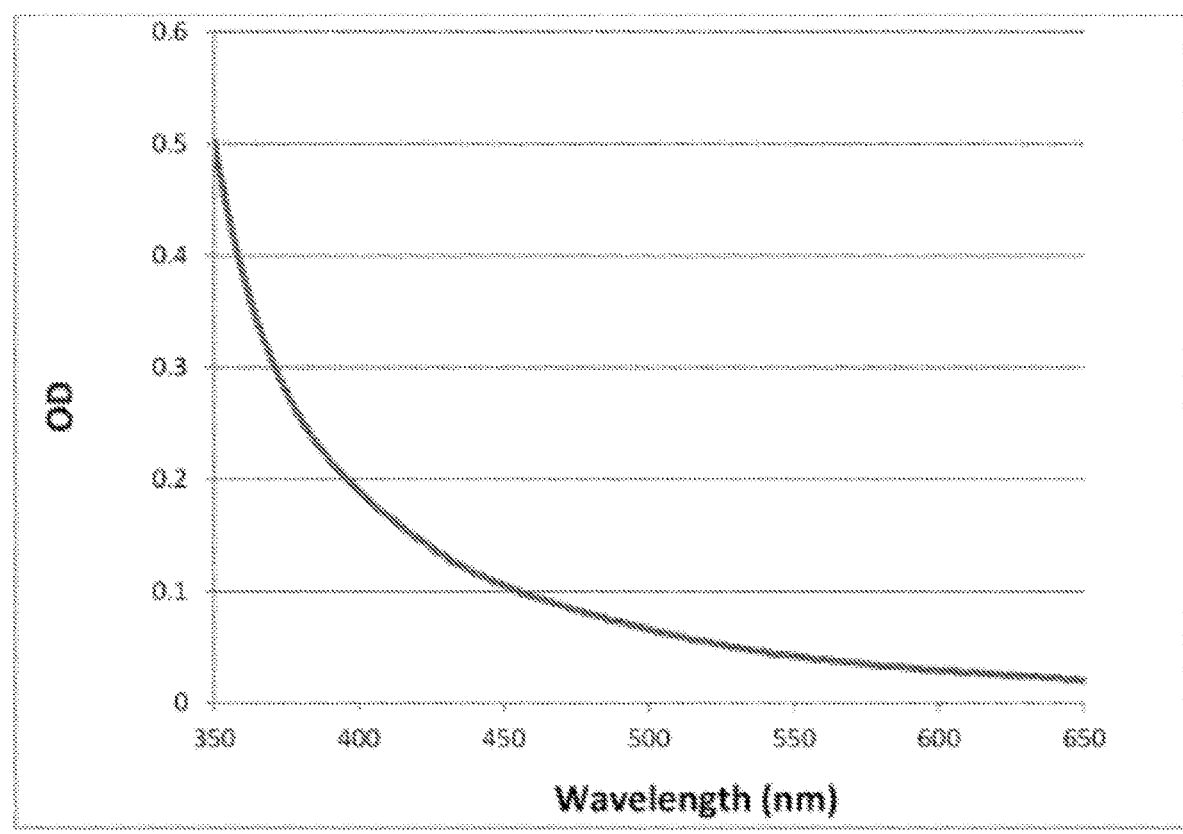

FIG. 18. Uv-vis spectrum of the dispersion of the capped zirconia nanocrystals in xylenes at 50 wt % loading FIG. 19. Thermal gravimetric analysis of the capped zirconia dispersed in xylenes at 50% loading. The calculated percent organic is as follows: % Mass at 200 C=50.32; % Mass at 700 C=46.59% and % Organics (% @200 C−% @700 C) % @200 C)=7.41%.

Figure 20:
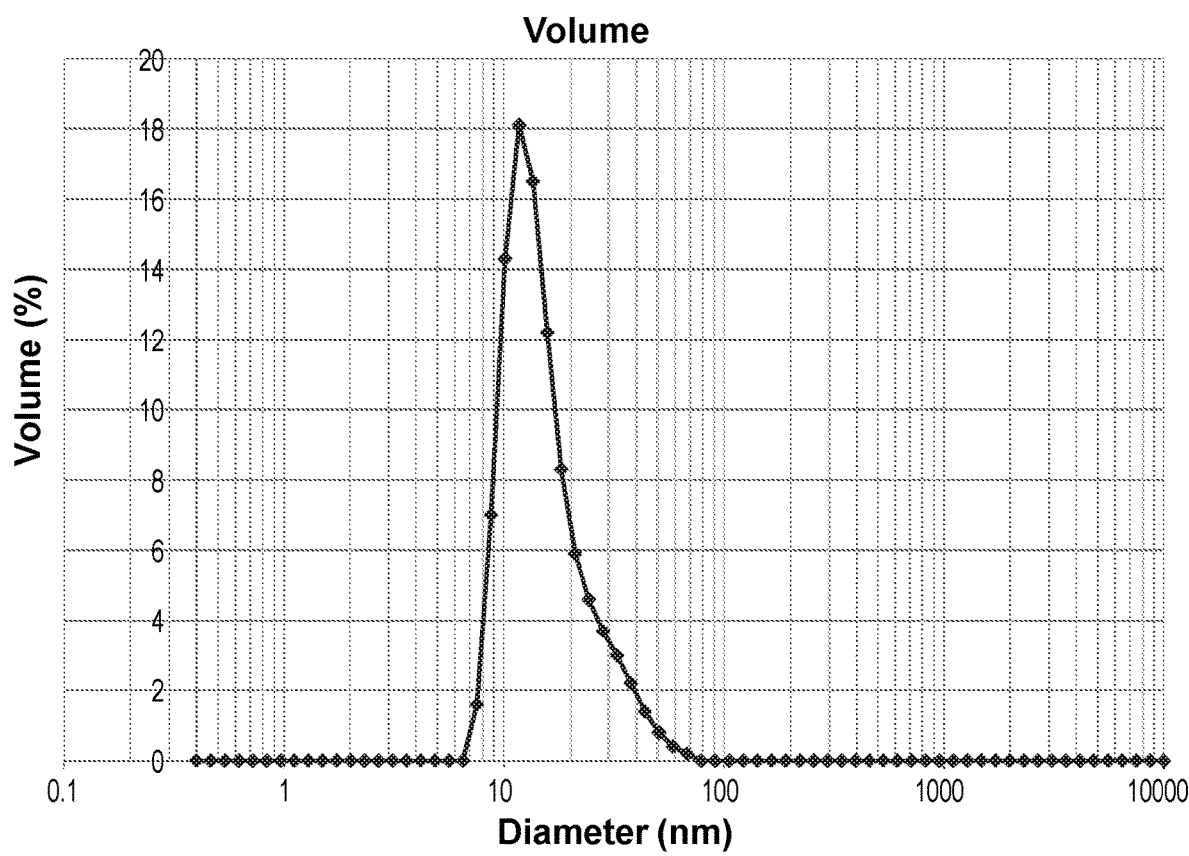

FIG. 20. Size distribution of the capped zirconia nanocrystal

Figure 21:
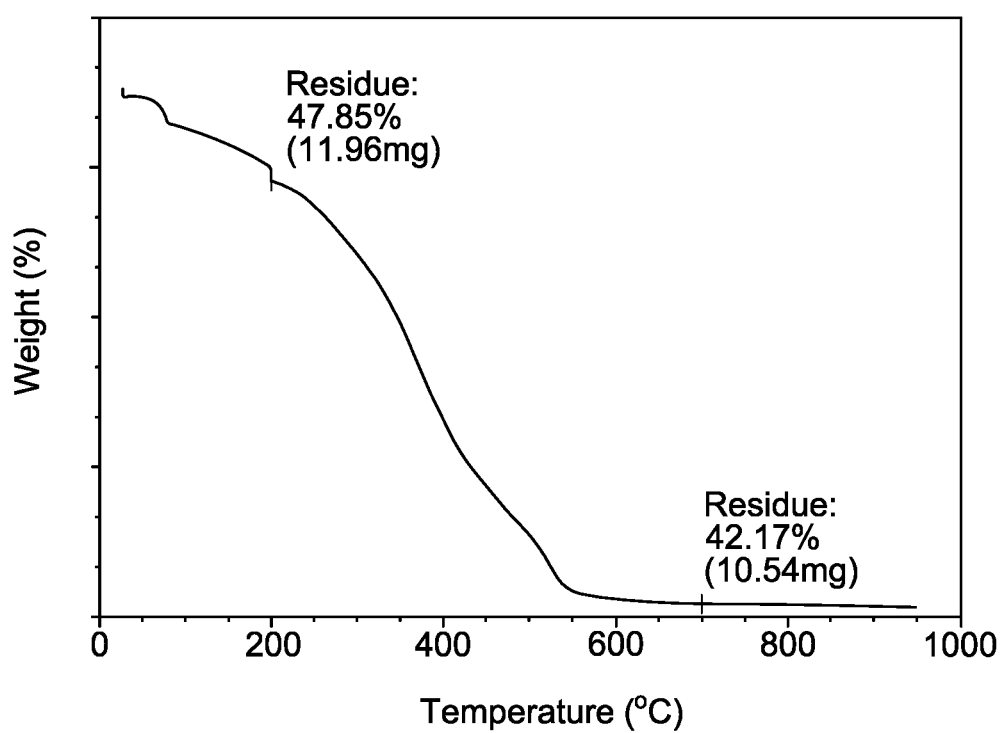

FIG. 21. Thermal gravimetric analysis of the dispersion of the capped zirconia with hmdz treatment (50 wt % in xylenes)

Figure 22:
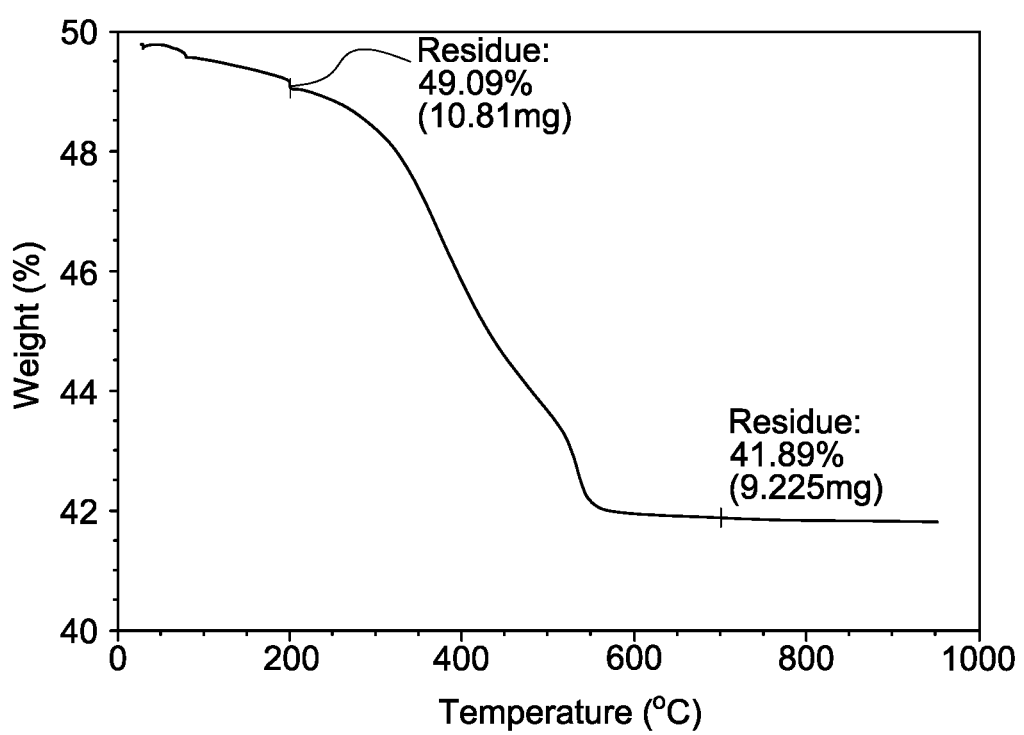

FIG. 22. Thermal gravimetric analysis of the dispersion of the capped zirconia with bzooh treatment (50 wt % in xylens). The calculated percent organic is as follows: % Mass at 200 C=49.09; % Mass at 700 C=41.89% and % Organics (% @200 C−% @700 C) % @200 C)=14.67%.

Figure 23:
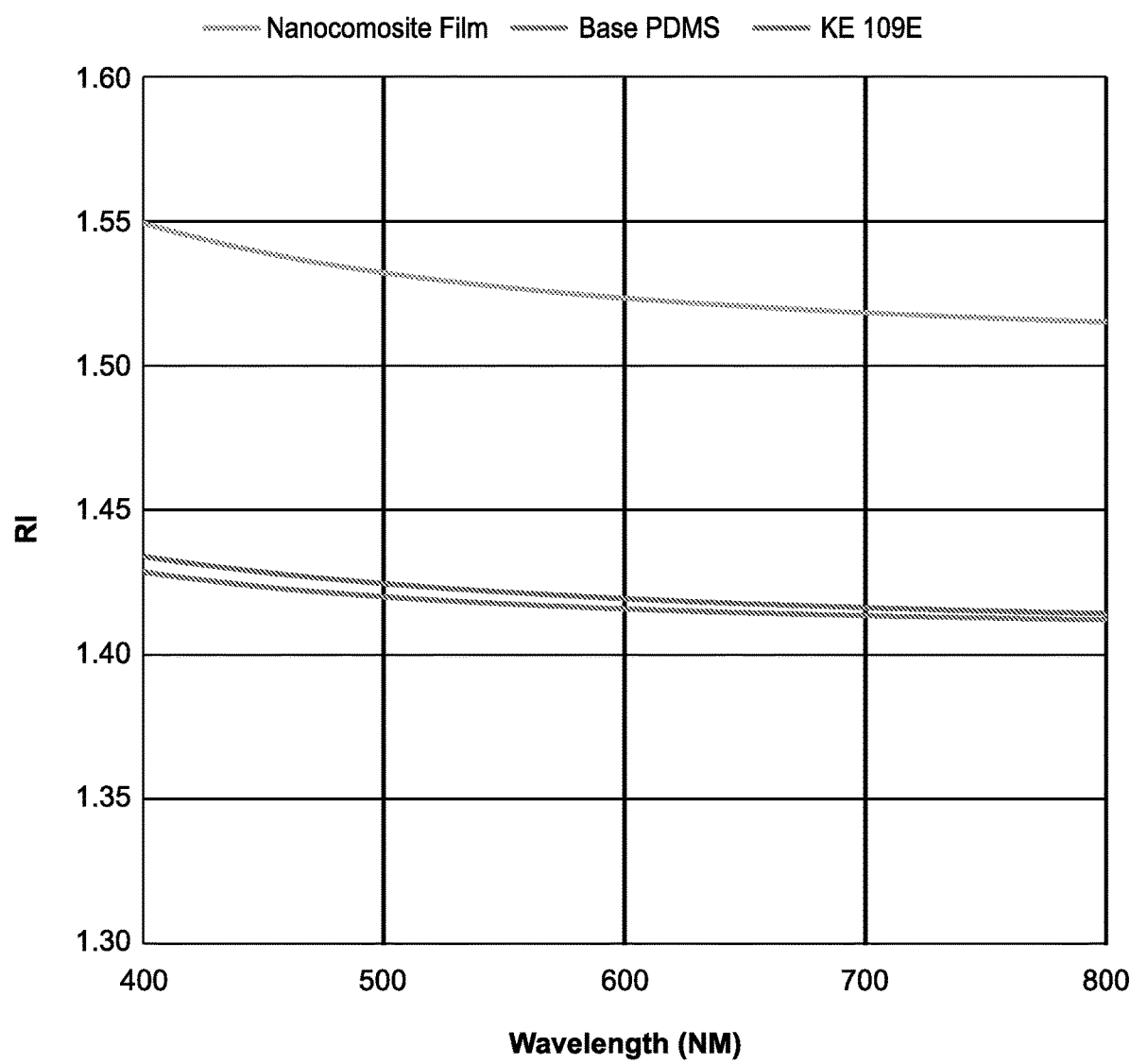

FIG. 23. Refractive index of the thermally cured nanocomposite film (top line), base polymer (bottom line) and KE-109E (middle line). The refractive index values at 450 nm, 589 nm and 633 nm are as follows:

| RI | 450 nm | 589 nm | 633 nm |
| --- | --- | --- | --- |
| NANOCOMPOSITE | 1.54 | 1.52 | 1.52 |
| BASE POLYMER | 1.42 | 1.42 | 1.41 |
| KE-109E | 1.43 | 1.42 | 1.42 |

Figure 24A:
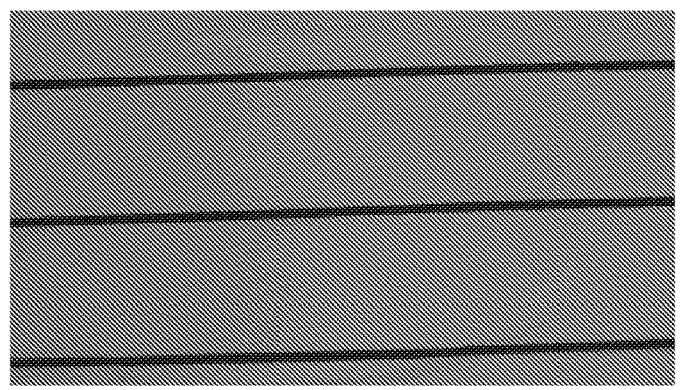

FIG. 24A. Base polymer before solder reflow thermal treatment.

Figure 24B:
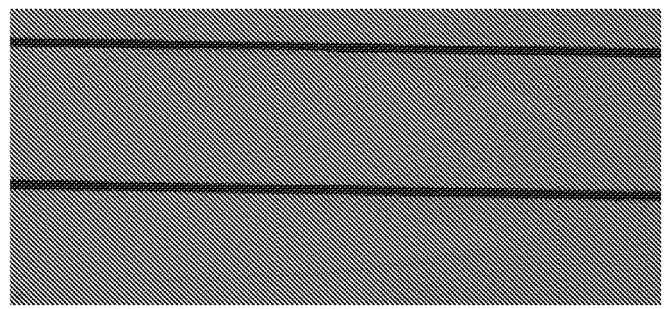

FIG. 24B. Base polymer after solder reflow thermal treatment.

Figure 24C:
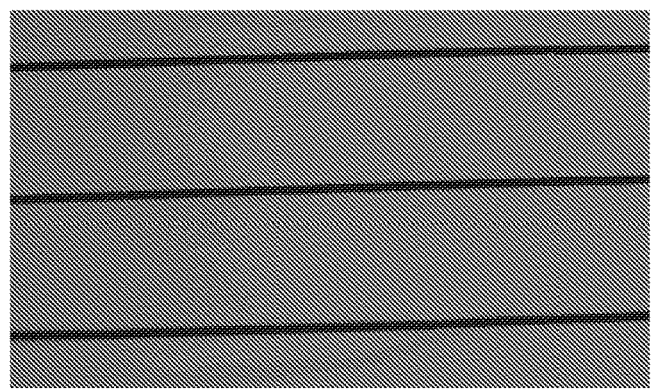

FIG. 24C. Nanocomposite film with 70% of the nanocrystals before solder reflow thermal treatment.

Figure 24D:
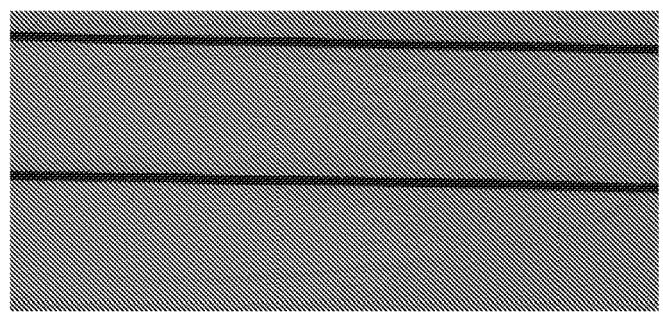

FIG. 24D. Nanocomposite film with 70% of the nanocrystals after solder reflow thermal treatment.

Figure 25:
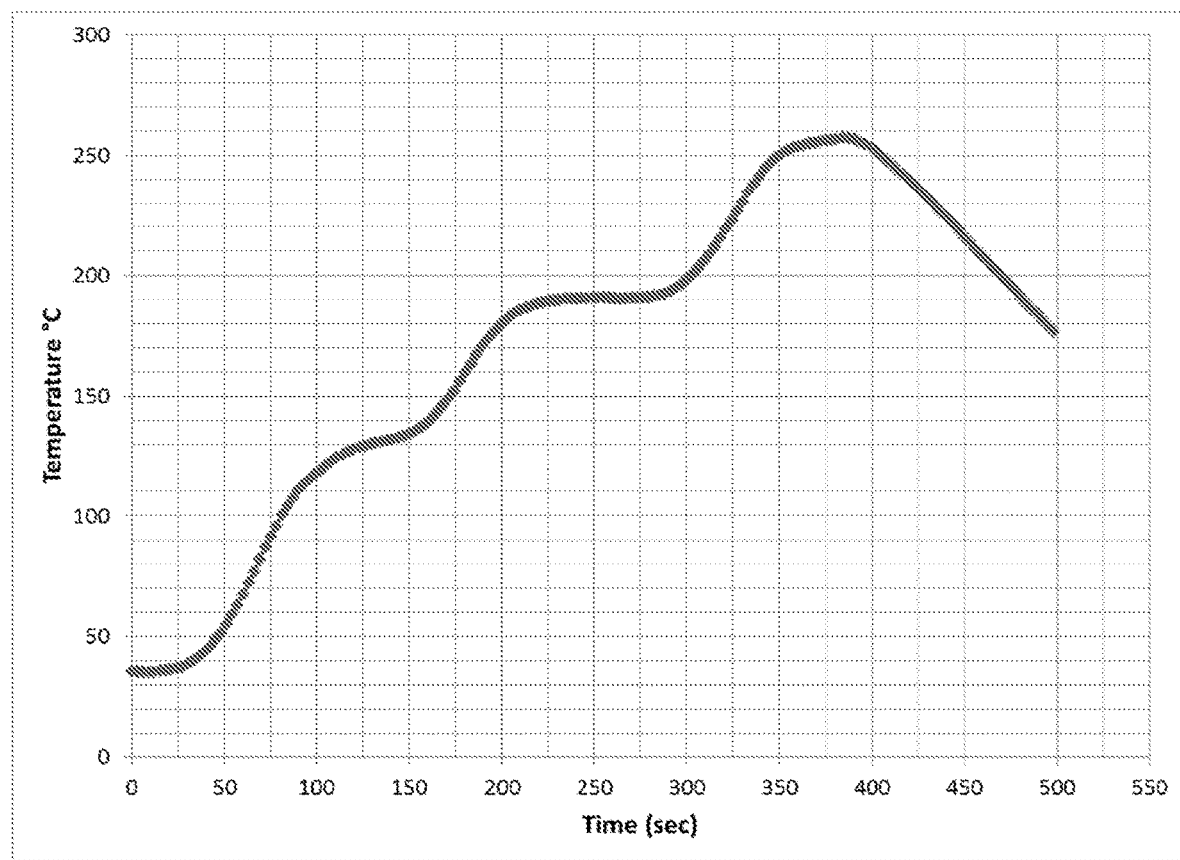

FIG. 25. A heating profile for solder reflow process

Figure 26:
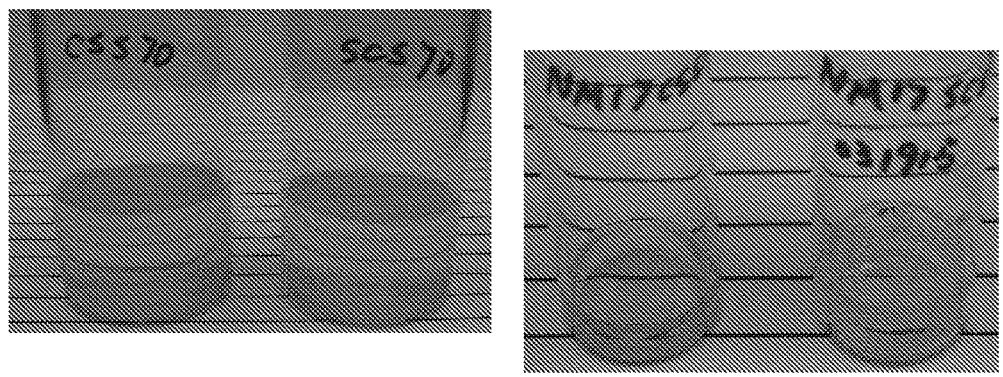

FIG. 26. Dispersions of the capped zro2 nanocrystals in a vinyl containing silicone at 70 wt % solid loading before (a) and after (b) solvent removal FIG. 27. Pictures of cavity-type led package without (left) and with (right) phosphor-deposited layer FIG. 28. Pictures of dam-type led package without (left) phosphor-deposited layer, with phosphor-deposited layer and near hemispherical shape (middle), and with phosphor-deposited layer and poor led coverage and phosphor settling (right)

Figure 29:
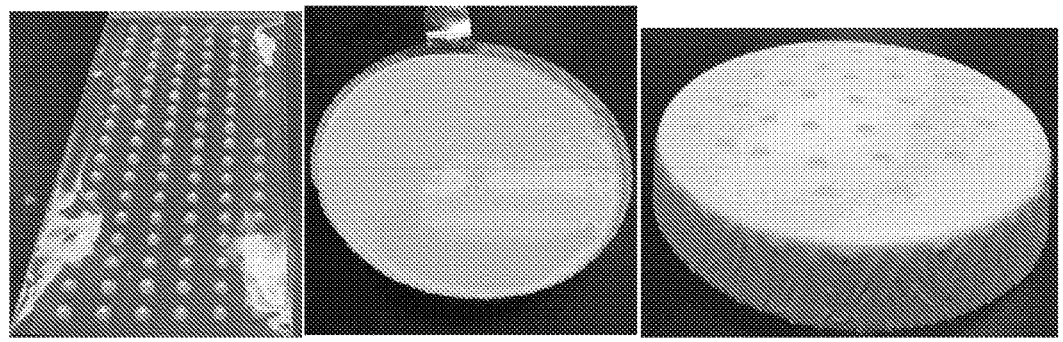

FIG. 29. Pictures of plastic domes (left), cured silicone over domes (middle), final silicone mold with cavities (right)

Figure 30:
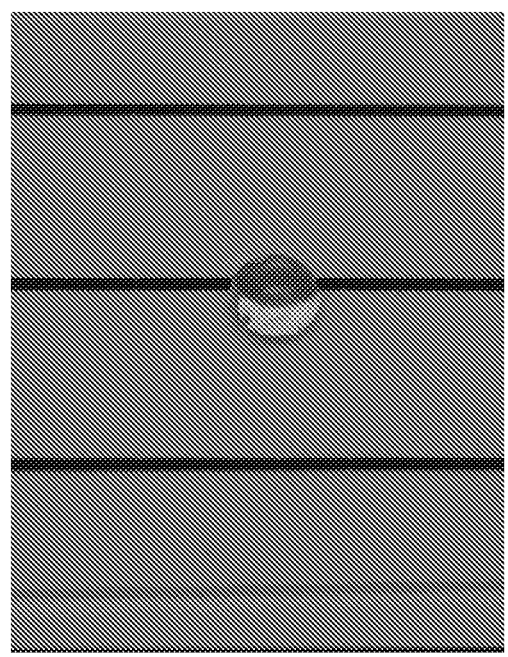

FIG. 30. The picture shows an example of a molded 2-mm diameter lens with good clarity. High refractive index hemispherical lenses can be made for various sizes/diameters with the solvent-free nanocomposite material

GENERAL DESCRIPTION OF CAPPING AGENTS

Figure 1:
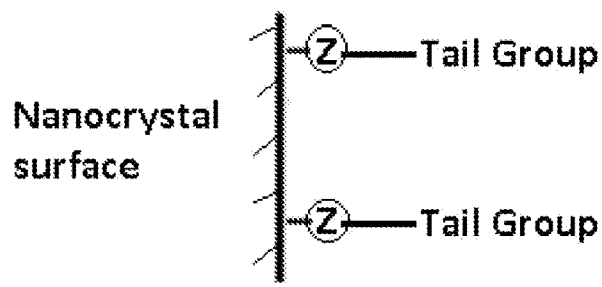
FIG. 1. Schematic of a capping agent comprising a head group and a tail group FIG. 2. Examples of tail group structures with a silicone chain (1) and a hydrocarbon chain (2)

The present disclosure describes a capping agent comprising a head group and a tail group. The head group, as represented by group Z shown in FIG. 1, is capable of binding to the surface of the nanocrystals through a covalent linkage.

The presently disclosed head group with covalent linkage may comprise oxygen, sulfur, phosphorus, carbon or silicon elements.

The head group with the silicon covalent linkage may comprise either a trialkoxysilane group or a trichlorosilane group, although bi- and mono-substituted alkoxy and chloro silanes are also possible. The head anchors to the surface of the metal oxide through a covalent bond with the hydroxide group (—OH) or —OR group wherein R is an alkyl or aryl group, present at the surface, eliminating an alcohol, alkyl chloride, water or HCl as a by-product.

The head group with the oxygen covalent linkage may comprise a carboxylic acid (—COOH) group. The head anchors to the surface of the nanocrystals through a covalent bond with the —OH or —OR groups (R=alkyl or aryl) present at the surface, eliminating an alcohol, or water as a by-product.

The head group with the phosphorus covalent linkage may comprise organophosphorus functional group (e.g., organophosphate group or an organophosphono group) for covalently binding to the nanocrystals. The organophosphorus functional group may be covalently bonded to a single tail group which can be generally represented by R—PO(OH)$_2$ for a phosphono group or R—O—PO(OH)$_2$ for a phosphate group where R represents a 2 to 12 carbon chain length. Specifically disclosed are phosphonic acid compounds comprising the structure Gn-R-Xm, wherein G is a silicone polymer terminal group; wherein R is a bridging group; wherein X is a phosphonic acid group having the structure: O, OH and wherein 'n' and 'm' are 1, 2, or 3. Such phosphonic acid compounds can be useful for the preparation of coated metal oxide nanoparticles and/or nanocomposites.

Figure 2:
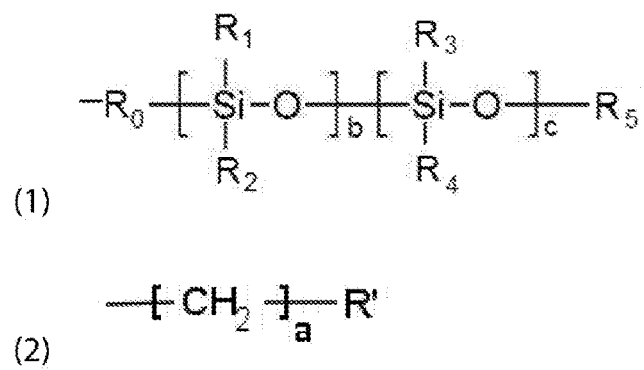

The tail group of the capping agent may comprise functional or a nonfunctional group, the groups may further comprise a silicone chain or a hydro-carbon chain, as shown in FIG. 2. The silicone chain of the presently disclosed functional or non-functional tail groups may comprise groups R1, R2, R3, R4, each may be selected from H, alkyl groups, aryl groups, polyaryl groups, alkenyl groups, alkynyl groups, epoxy groups, acrylate groups or the combination thereof. R1, R2, R3, R4, each may further comprise a non-functional silicone chain such as dimethyl or phenyl methyl silicone, and silicone chains containing functional groups such as H, alkyl groups, aryl groups, polyaryl groups, vinyl groups, allyl groups, epoxy groups, acrylate groups or the combination thereof. The groups R1, R2, R3, and R4 may have an arrangement to form alternating, random, or block polymers.

Figure 3:
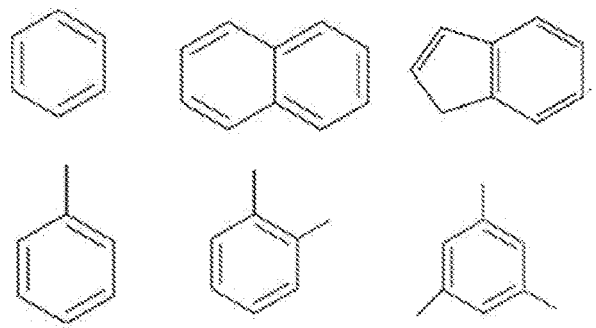
FIG. 3. Selected examples of r1, r2, r3, and r4 with non-functional group (1) and functional group (2)
Figure 4:
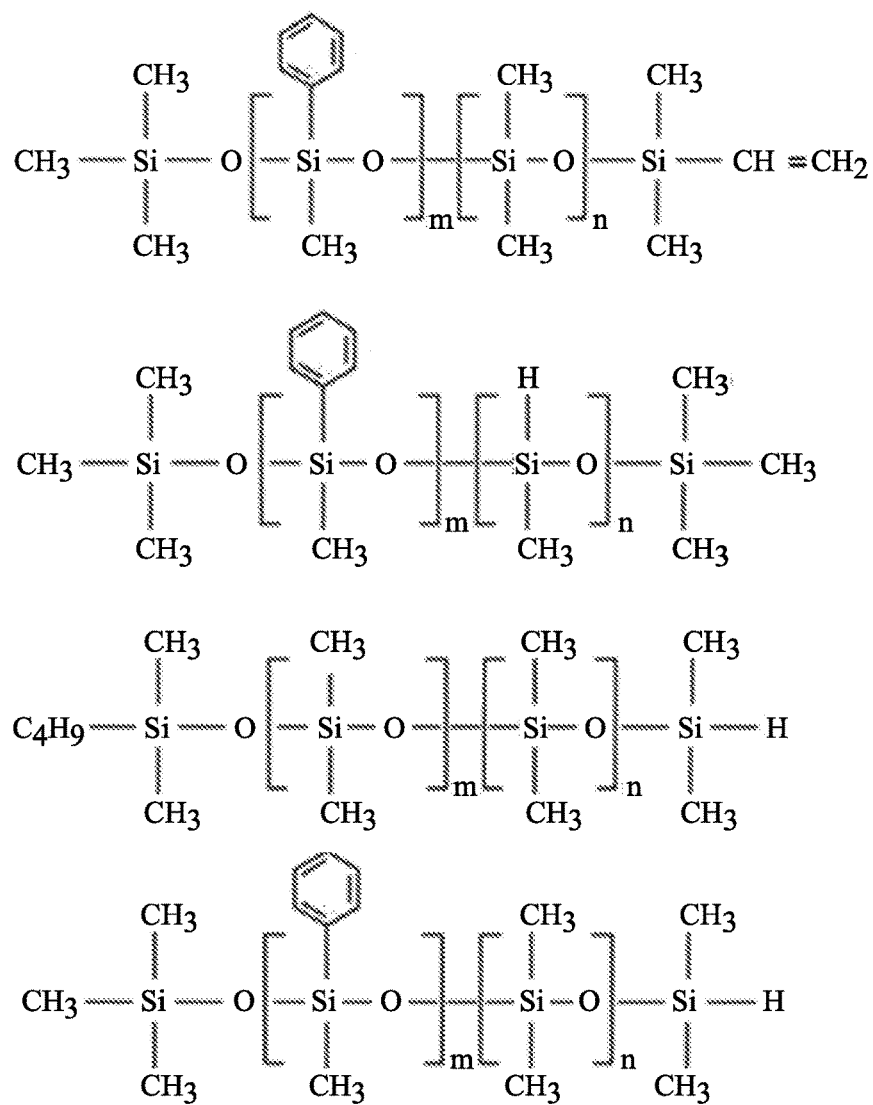
FIG. 4. Selected examples of tail groups

In FIG. 2 the values for 'b' and 'c' independently may have range from 0 to 60 in the polymer chain while 'b' and 'c' cannot both be zero at the same time, and the connecting group, $R_0$, connecting the tail group to the head group may comprise of —$C_nH_{2n}$—, n=0-8, examples of connecting group may comprise —($CH_2$)—, —($C_2H_4$)—, —($C_3H_6$)—, —($C_4H_8$)— repeating units, ether groups, or carbonyl groups. R5 may be an end group such as Si(CH3)3, Si(CH3)2H, Si(CH3)2(CHCH2), or Si(CH3)2(C4H9). Selected examples of R1, R2, R3 and R4 may comprise compounds shown in FIG. 3. Selected examples of the tail group may comprise compounds including the compounds listed in FIG. 4.

The hydro-carbon chain of the presently disclosed functionalized or non-functionalized tail groups may comprise of $(CH_2)_a$ unit with 'a' having a value 0 to 18, the R' in FIG. 2 may comprise —H or an alkyl group such as methyl, ethyl, butyl, or t-butyl, or alkenyl or alkynyl group such as vinyl, allyl, hexenyl or octenyl.

The presently disclosed capping agent with non-functional tail groups may comprise methyltrimethoxysilane, ethyltrimethoxysilane, propyltrimethoxysilane, propyltriethoxysilane, n-octyltrimethoxysilane, n-octyltriethoxysilane, n-dodecyltrimethoxysilane, n-dodecyltriethoxysilane, n-hexadecyltrimethoxysilane, octadecyltrimethoxysilane, phenytrimethoxysilane, phenylethylphenyltrimethoxysilane, 2-[methoxy(polyethyleneoxy)propyl]-trimethoxysilane, methoxytri(ethyleneoxy)propyltrimethoxysilane, octanoic acid, acetic acid, propionic acid, 2-[2-(2-methoxyethoxy)ethoxy] acetic acid, oleic acid, lauric acid, benzoic acid or isomers and mixtures thereof.

The presently disclosed capping agent with functional tail groups may comprise vinyltrimethoxysilane (VTMS), allyltrimethoxysilane (ATMS), 1-hexenyltrimethoxysilane, 1-octenyltrimethoxysilane (OTMS).

Figure 5:
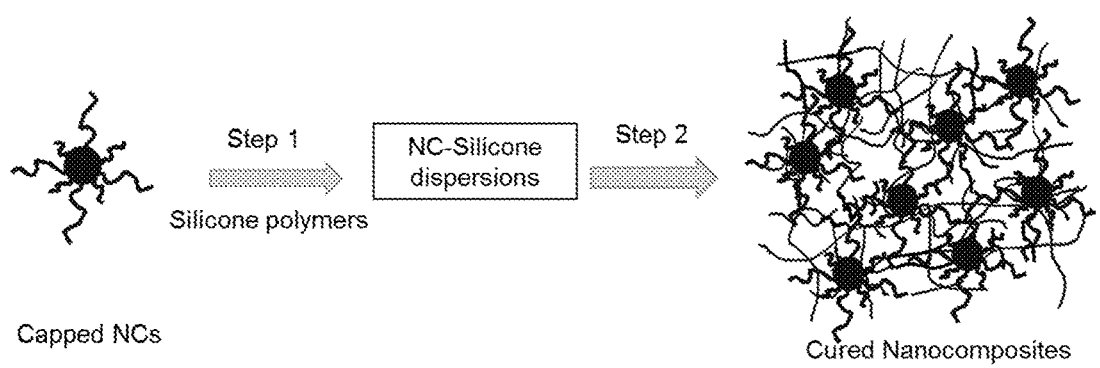
FIG. 5. Strategy one for forming silicone nanocomposites comprising siloxane/silicone capped nanocrystals.
Figure 6:
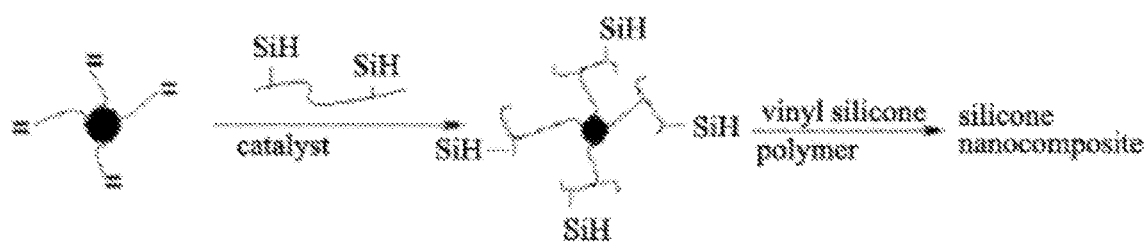
FIG. 6. Schematic description of the strategy two for forming silicone nanocomposites comprising siloxane/silicone capped nanocrystals FIG. 7. An exemplary silicone capping agent FIG. 8. Synthesis route of an exemplary silicone capping agent FIG. 9. An dispersion of the zirconia capped with silicone chain and vinly functional siloxane in a vinyl containing silicone FIG. 10 an illustration for secondary and tertiary capping of nanocrystals as described in route 2

The current disclosure provides two strategies to improve the compatibility of the capped nanocrystals with a silicone matrix. The first strategy is shown in FIG. 5, is to cap the nanocrystals with at least one type of a capping agent comprising a silicone chain with a head group capable of covalently bonding to the surface of the nanocrystals and a tail group enhancing compatibility of the nanocrystals to the silicone matrix. The second strategy, shown in FIG. 6, is to graft silicone polymer chain on to nanocrystals capped with one type of functional hydro-carbon chains or silicone chains. These functional groups are capable of reacting with silicone monomers, polymers, or mixtures as secondary or tertiary capping agents to further build up the grafted silicone chain length in order to improve the compatibility of the nanocrystals to the silicones to be dispersed in. The added silicone chains can be optionally functional. The functional groups of the grafted silicone chains can crosslink with pre-polymers of the matrix silicone via chemical reactions, such as hydrosilylation reaction to enhance the mechanical properties of the nanocomposites.

By tuning the composition, structure, and length of the capping agents the presently disclosed capped nanocrystals can be incorporated into silicone monomers, polymers, or mixtures directly or in a solvent, followed by solvent removal/flash-off to provide a substantially solvent-free nanocomposites or a solvent-free silicone dispersions.

The presently disclosed silicone capped nanocrystals may additionally comprise hydro-carbon chain capping agents, as described in US patent application No. 2012/0088845, which is incorporated by reference herein. The hydro-carbon chains of the capping agents may comprise non-functional tail groups or functional tail groups. The non-functional tail groups contain hydro-carbon chains, such as alkyl groups, with 1 to 18 carbon chain length, or 6 to 18 carbon chain length. The capping agent with non-functional tail groups may comprise methyl trimethoxysilane, ethyltrimethoxy silane, n-propyltrimethoxysilane, n-propyltriethoxysilane, n-octyltrimethoxysilane, n-octyltriethoxysilane, phenytrimethoxysilane, phenylethylphenyltrimethoxysilane, 2-[methoxy(polyethyleneoxy)propyl]-trimethoxysilane, methoxytri(ethyleneoxy)propyltrimethoxysilane, octanoic acid, acetic acid, propionic acid, 2-[2-(2-methoxyethoxy) ethoxy] acetic acid, oleic acid, benzoic acid or isomers and mixtures thereof. Functional tail groups may comprise vinyl, allyl-, 1-hexenyl, 1-octeny.

An Exemplary Silicone Capping Agent

Figure 7:
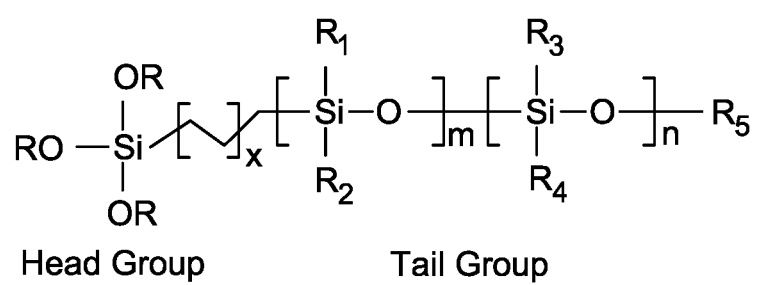

An exemplary silicone capping agent is shown in FIG. 7.

The head group in the capping agent shown in FIG. 7 is an alkoxysilane that is capable of attaching to the surface of the nanocrystals. The tail group of the capping agent comprise a silicone polymer wherein groups R1, R2, R3, and R4, independently comprise an alkyl, aryl, poly aryl or alkenyl groups. The groups R1, R2, R3, and R4 may have an arrangement to form alternating, random, or block polymers. In FIG. 7 the values for 'm' and 'n' independently can have a range between 0 to 60. R5 may be an end group such as Si(CH3)3, Si(CH3)2H, Si(CH3)2(CHCH2), or Si(CH3)2(C4H9).

Description of the Capping Agent Synthesis

Figure 8:
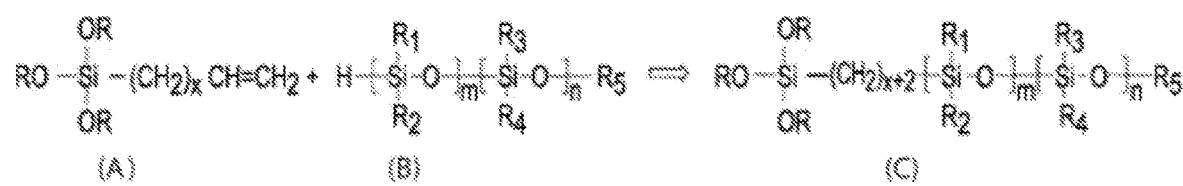

The synthesis route of an exemplary capping agent is shown in FIG. 8. The reaction between a monofunctional Si—H containing silicone polymer and an alkenyl functional alkoxysilane; is catalyzed using a hydrosilylation catalyst as described in Patent Application No. US 61/895,363, as incorporated by reference herein. The $R_1$, $R_2$, $R_3$, and $R_4$ of the monofunctional Si—H containing silicone polymer independently comprise an alkyl, aryl, poly aryl or alkenyl groups which may have an alternating, random, or block arrangement; 'm' and 'n' independently can have a range between 0 to 60; and R5 may be an end group such as Si(CH3)3, Si(CH3)2H, Si(CH3)2(CHCH2), or Si(CH3)2(C4H9). The alkenyl functional alkoxysilane has the general formula, R'nSi(OR)(4-n) where n=1-3, R=an alkyl group, such as a methyl or an ethyl group; R' is an alkenyl functional group, x=0-6. Hydrosilylation catalysts may be one or more of platinum metal, platinum compounds, and platinum complexes. Selected examples of platinum compounds and platinum complexes may be exemplified by chloroplatinic acid, chloroplatinic acid hexahydrate, Karstedt's catalyst, Pt(ViMe$_2$-SiOSiViMe$_2$)$_2$), dichloro-bis(triphenylphosphine)platinum (II), cis-dichloro-bis(acetonitrile)platinum(II), dicarbonyldichloroplatinum(II), platinum chloride, platinum oxide and others. The platinum metal can be deposited on a support such as charcoal, alumina, zirconia, carbon, silica gel, and others. Any platinum containing material which affects the reaction between the silicon hydride and the unsaturated portion of the unsaturated compound may be used.

Suitable amounts of the platinum containing compounds and the platinum complexes vary within wide limits. Concentrations on the order of 1 mole of catalyst (providing one mole of platinum) per billion moles of unsaturated groups in the unsaturated compound may be useful. Concentrations can be as high as 1 to 10 moles of catalyst per thousand moles of unsaturated groups in the unsaturated compound may also be employed. Preferable concentrations are from 1 mole of platinum per 1,000 moles of unsaturated groups to 1 mole of platinum per 1,000,000 mole of unsaturated groups in the unsaturated compound. Suitable amounts of supported platinum include, for example, from at least about 0.1 weight percent, or 0.1 to about 10 weight percent, or from about 0.5 to 5 weight percent based upon elemental platinum.

The catalyst may be dissolved in a solvent or silicone, preferably low molecular weight silicones for ease of handling and to facilitate measuring the minute amounts needed. The solvent or silicone may be inert. Suitable solvents include the various hydrocarbon solvents such as benzene, toluene, xylene, and mineral spirits and polar solvents such as alcohols, various glycols and esters, and low molecular weight silicone oils, such as dimethyl silicone, phenyl methyl silicone, optionally vinyl containing silicone oils.

The relative amounts of silicon hydride and unsaturated compound employed in the process herein can vary within wide practical limits. One unsaturated linkage, for example, ethylene, is the stoichiometric requirement per silicon bonded hydrogen atom. However there is no absolute necessity for equivalent amounts of the reactants to be employed and any desired excess of either reactant can be present. In fact an excess of one reactant, typically the unsaturated compound, may often be desirable to force the reaction to completion or to make the greatest use of the reactant which is the most expensive or most rare.

Nanocrystals Comprising Silicone Capping Agent

Nanocrystals may be capped with at least one capping agent comprising presently disclosed silicone capping agent shown in FIG. 7. The head group may comprise a trimethoxysilyl group and the tail group may comprise a dimethyl silicone, methyl phenyl silicone or combination of both. An exemplary capping agent may comprise $(MeO)_3SiO—(CH_2)n-((Si(R_5,R_6)_2O)_x—Si(Me_2)C_4H_9$ with R5 and R6 being independently methyl or phenyl. The capping agent may have linear or branched structure with the value for 'x' varying in the range of 1-100, preferably 2-15; n=0-8, preferably 2-3. The nanocrystals can be metal oxides selected from zirconium oxide, titanium oxide, hafnium oxide, zinc oxide, yttrium oxide, and niobium oxide and/or mixtures of at least two of these and/or alloys of at least two thereof. The nanocrystals comprising silicone capping agents may optionally also comprise one or more of functional capping agents including, vinyltrimethoxysilane (VTMS), allyltrimethoxysilane (ATMS), 1-hexenyltrimethoxysilane, 1-octenyltrimethoxysilane (OTMS) or one or more of non-functional capping agents such as—methyltrimethoxysilane, ethyltrimethoxysilane, propyltrimethoxysilane, butyltrimethoxysilane, n-propyltrimethoxysilane, isopropyltrimethoxysilane, n-butyltrimethoxysilane, isobutyltrimethoxysilane, sec-butyltrimethoxysilane, pentyltrimethoxysilane, isopentyltrimethoxysilane, sec-pentyltrimethoxysilane, hexyltrimethoxysilane, heptyltrimethoxysilane, n-octyltrimethoxysilane, n-octyltrimethoxysilane, n-dodecyltrimethoxysilane, n-dodecyltrimethoxysilane phenytrimethoxysilane, phenylethylphenyltrimethoxysilane, 2-[methoxy(polyethyleneoxy)propyl]-trimethoxysilane, methoxytri(ethyleneoxy)propyltrimethoxysilane, propanoic acid, octanoic acid, acetic acid, ethanoic acid, propionic acid, isopropanoic acid, butanoic acid, isobutanoic acid, sec-butanoic acid, pentanoic acid, hexanoic acid, heptanoic acid, 2-[2-(2-methoxyethoxy)ethoxy] acetic acid, oleic acid, lauric acid, benzoic acid, methylphosphonic acid, ethylphosphonic acid, propylphosphonic acid, butylphosphonic acid, isobutylphosphonic acid, sec-butylphosphonic acid, butyltrimethoxyphosphonic acid, pentylphosphonic acid, isopentylphosphonic acid, sec-pentylphosphonic acid, hexylphosphonic acid, heptylphosphonic acid, n-octylphosphonic acid, n-octyltriphosphonic acid, n-dodecylphosphonic acid, n-dodecylphosphonic acid phenylphosphonic acid.

Alternatively the capped nanocrystals may be comprised of single or multi non-functional capping agents comprising of the hydrocarbon and a silicone capping agent represented by the structures in FIG. 2. The head groups for the capping agents may comprise a carboxylic acid (—COOH) group, a phosphorous linkage comprising of an organophosphorus functional group (e.g., organophosphate group or an organophosphono group), or an alkoxy silane linkage.

Process of Capping Nanocrystals

The present disclosure provides an exemplary non-limiting process of making presently disclosed silicone capped nanocrystals comprising suspending the as synthesized nanocrystals, for example, described in US patent application No. 2012/0088845, which is incorporated by reference herein, in a nonpolar solvent such as toluene; adding presently disclosed silicone capping agent to the suspension at 1 to 60% by weight of the nanocrystals; optionally heating the solution to between 60 to 150° C. for 30 to 60 minutes; and washing the nanocrystals to remove byproducts and drying under vacuum.

The present disclosure provides an exemplary non-limiting process of making presently disclosed silicone capped nanocrystals comprising suspending as synthesized nanocrystals in nonpolar solvent such as toluene; adding presently disclosed silicone capping agent to the suspension at optionally 1 to 10%, 10 to 20%, 20 to 30%, 30 to 40%, 40 to 50% or 50 to 60% by weight of the nanocrystals; optionally heating the solution to between 60 to 150° C. for 30 to 60, 60 to 90, 90-120 minutes; optionally adding water to the reaction mixture, the amount of the water can be 0.01 to 1, or 1 to 5, or 5 to 10 percent by weight of the nanocrystals and continuing to heat the solution between 60 to 150° C. for additional 5 to 15, 15 to 30, 30 to 45, or 45 to 60 minutes. Alternatively, the order of the addition of the capping agent and water can be changed. This process is followed by purification of the nanocrystals by repeating process of precipitation and re-dispersion of the capped nanocrystals with anti-solvent, such as ethanol, methanol, and solvent such as toluene, hexanes, heptanes; and centrifuging and removing the residual solvents by drying under vacuum.

In another example the nanocrystals may be capped with more than one type of capping agent. The nanocrystals may be capped with at least one type of the silicone capping agent and by adding two or more capping agents such as functional and non-functional capping agents. The functional groups may comprise a silicone chain or a hydro-carbon chain with alkenyl or alkynyl functional groups. The nonfunctional groups may be an alkyl group. Optionally water may be added during the capping process. The order of the addition sequence of the capping agents and water can be changed from process to process.

An exemplary non-limiting process of capping nanocrystals with more than one type of capping agent is described herein: As synthesized nanocrystals are suspended in a nonpolar solvent such as toluene; and presently disclosed silicone capping agent is added to the suspension at optionally 1 to 10%, 10 to 20%, 20 to 30%, 30 to 40%, 40 to 50% or 50% to 60% by weight of the nanocrystals. The solution is heated between 60 to 150° C. for 30 to 60, 60 to 90, 90-120 minutes; this process is followed by addition of a second type of capping agent with functional groups, preferably alkenyl or alkynyls to the reaction mixture. This capping agent may comprise, for example, vinyl trimethoxysilane or allyltrimethoxy silane. The amount of the capping agents is 0.1 to 30 percent by weight of the nanocrystals. The mixture is heated for another 5 to 15, 15 to 30, 30 to 45, or 45 to 60 minutes. at 60-150 C. Optionally water is added to the reaction mixture which is heated for additional 5 to 15, 15 to 30, 30 to 45, or 45 to 60 minutes. The amount of the water may be 0.01 to 10 percent by weight of the nanocrystals and, the addition sequence of the capping agents and water can be changed, such as adding water before the addition of capping agents or adding water before, after or with the first capping agent or the second capping agent. The capped nanocrystals are then washed to be purified by precipitating capped nanocrystals with polar solvent, such as ethanol, methanol, and re-dispersing the nanocrystals in non-polar solvent, such as hexanes, heptanes; and finally centrifuging and removing the solvents by and dried under vacuum. The functional capping agents which are alkenyl or alkynyl functional capping agents help create a further functionalized zirconia nanoparticle capable of crosslinking with the thermal curing of the silicones via the hydrosilylation reaction chemistry.

Another exemplary non-limiting process of capping nanocrystals with more than one type of capping agent is described herein: As synthesized nanocrystals are suspended in a nonpolar solvent such as toluene; and presently disclosed silicone capping agent is added to the suspension at optionally 1 to 10%, 10 to 20%, 20 to 30%, 30 to 40%, 40 to 50% or 50 to 60% by weight of the nanocrystals. The solution is heated between 60 to 150° C. for 30 to 60, 60 to 90, 90-120 minutes; this process is followed by addition of a second type of capping agent with non-functional groups, preferably alkyl groups. This capping agent may comprise, for example, methyltrimethoxysilane, ethyltrimethoxysilane, propyltrimethoxysilane, butyltrimethoxysilane, n-propyltrimethoxysilane, isopropyltrimethoxysilane, n-butyltrimethoxysilane, isobutyltrimethoxysilane, sec-butyltrimethoxysilane, pentyltrimethoxysilane, isopentyltrimethoxysilane, sec-pentyltrimethoxysilane, hexyltrimethoxysilane, heptyltrimethoxysilane, n-octyltrimethoxysilane, n-octyltrimethoxysilane, n-dodecyltrimethoxysilane, n-dodecyltrimethoxysilane phenytrimethoxysilane, phenylethylphenyltrimethoxysilane, 2-[methoxy(polyethyleneoxy)propyl]-trimethoxysilane, methoxytri(ethyleneoxy)propyltrimethoxysilane, propanoic acid, octanoic acid, acetic acid, ethanoic acid, propionic acid, isopropanoic acid, butanoic acid, isobutanoic acid, sec-butanoic acid, pentanoic acid, hexanoic acid, heptanoic acid, 2-[2-(2-methoxyethoxy)ethoxy] acetic acid, oleic acid, lauric acid, benzoic acid, methylphosphonic acid, ethylphosphonic acid, propylphosphonic acid, butylphosphonic acid, isobutylphosphonic acid, sec-butylphosphonic acid, butyltrimethoxyphosphonic acid, pentylphosphonic acid, isopentylphosphonic acid, sec-pentylphosphonic acid, hexylphosphonic acid, heptylphosphonic acid, n-octylphosphonic acid, n-octyltriphosphonic acid, n-dodecylphosphonic acid, n-dodecylphosphonic acid phenylphosphonic acid.

The amount of the capping agents is 0.1 to 30 percent by weight of the nanocrystals. The mixture is heated for another 5 to 15, 15 to 30, 30 to 45, or 45 to 60 minutes. at 60-150 C.; optionally water is added to the reaction mixture which is heated for additional 5 to 15, 15 to 30, 30 to 45, or 45 to 60 minutes. The amount of the water may be 0.01 to 1 percent, 1-5 percent, 5 to 10 percent by weight of the nanocrystals and, the addition sequence of the capping agents and water can be changed, such as adding water before the addition of capping agents or adding water before, after or with the first capping agent or the second capping agent. The capped nanocrystals are then washed to be purified by precipitating capped nanocrystals with polar solvent, such as ethanol, methanol, and re-dispersing the nanocrystals in non-polar solvent, such as hexanes, heptanes; and finally centrifuging and removing the solvents by and dried under vacuum. The functional capping agents which are alkenyl or alkynyl functional capping agents help create a further functionalized zirconia nanoparticle capable of crosslinking with the thermal curing of the silicones via the hydrosilylation reaction chemistry.

Water addition during the capping reaction in this invention can enhance passivation of the nanocrystal surface by improving surface coverage and removing moisture reactive groups, such as methoxyl or ethoxyl groups, left on capped nanocrystals. These reactive groups can cause change of the surface chemistry of the nanocrystals and lead to instability of the nanocrystal. Furthermore, these reactive groups generally have high polarity. The polar-polar inter-reaction can result in nanocrystal-nanocrystal interactions and may lead to a thickening of the dispersion over time. In both cases, the shelf life of the dispersion can be affected. Additionally, the thickening can result in a solvent-free nanocrystal dispersion which is difficult for further processing.

An effective capping on nanocrystals, specifically, good passivation and coverage, can reduce the nanocrystal interparticle interactions and promote the nanocrystal-silicone polymer interactions, which is important for optically clear solvent-free nanocomposites.

Alternatively a passivating agent may be used to further passivate the surface of the nanocrystals. The passivating agent may comprise, for example, hexamethydisilazane, a carboxylic acid including benzoic acid, acetic acid, trifluoroacetic acid, or an organophosphonic acid including methyl phosphonic acid, alkylphosphonic acid. The passivating agent may also comprise a radical scavenger, for example, butylhydroxytoluene, Eversorb 93, or 1,4-bis(2-methylstyryl)benzene. In an exemplary non-limiting process of adding radical scavengers to previously capped nanocrystals, previously capped nanocrystals are suspended in a nonpolar solvent, such as xylene, and a radical scavenger is added to the suspension at optionally 1 to 5%, 5 to 10%, 10 to 15%, 15 to 20%, 20 to 25% or 25 to 30% by weight of the nanocrystals dispersion. The solution is heated between 25 to 50° C. for 0.5 to 1, 1 to 8, 8 to 24 hours. No purification of these materials is done and is used in this state in subsequent reactions.

An exemplary non-limiting process of passivating capped nanocrystals with one or more type of capping agent is described herein: Previously capped nanocrystals are suspended in a nonpolar solvent, such as xylene, and passivating agent is added to the suspension at optionally 1 to 5%, 5 to 10%, 10 to 15%, 15 to 20%, 20 to 25% or 25 to 30% by weight of the nanocrystals dispersion; The solution is heated between 25 to 50° C. for 0.5 to 1, 1 to 8, 8 to 24 hours. The passivating agent may comprise, for example, hexamethydisilazane, a carboxylic acid, or an organophosphonic acid. The passivated capped nanocrystals are purified by either drying under vacuum directly or by precipitating the passivated capped nanocrystals with polar solvent, such as ethanol or methanol, centrifuging, removing the solvents, and drying under vacuum. The passivated capped nanocrystals are dispersed into a non-polar solvent, such as toluene, xylene, or heptane. Optionally, further passivation of the passivated capped nanocrystals can be repeated by sequentially treating the passivated capped nanocrystals with additional passivating agent. Optionally, no purification of the passivated capped nanocrystals is done and the material is used in the unpurified state.

Dispersing Capped Nanocrystals in Silicones for a Solvent-Free Silicone Nanocomposite The present disclosure provides a process of dispersing the presently disclosed silicone capped nanocrystals in silicone monomers, polymers or mixtures there-of using two routes: route-1 and route-2. The silicone monomers, polymers or mixtures there-of may comprise vinyl containing material, hydride containing material, non-functional material or other types of silicone monomers or polymers or co-polymers.

Route-1

Route 1 describes an exemplary non-limiting process for dispersion of the nanocrystals directly into silicones, including silicone monomers, polymers or mixtures there-of, such as a vinyl containing siloxane or silicone by mixing the solid nanocrystals with liquid silicone via mechanical agitation, e.g. turbulent or non-turbulent mixing, optionally with heat.

Alternatively, a solvent can be used to assist the dispersion process. The nanocrystals are first mixed with a solvent at 5-90 wt % loading via mechanical agitation, optionally with heat, to get a nanocrystal dispersion; the nanocrystal dispersion is then blended with a silicone, optionally a silicone in a solvent; the solvent is subsequently removed to get a solvent-free nanocrystal dispersion or nanocomposites in a silicone.

Tuning the composition, structure, and chain length or molecular weight of the silicone capping agent on the capped nanocrystals and the silicone polymers to be dispersed in can be important to provide homogeneous and clear solvent-free silicone nanocomposite or nanocrystal dispersion. The nanocrystals are capped with at least one type of silicone capping agents, functional and/or non-functional, as shown in FIG. 2 (1), and having linear or branched structure. Optionally, the nanocrystals may also be capped with at least one type of functional hydrocarbon capping agents, as shown in FIG. 2 (2).

The presently disclosed siloxane or silicone polymer chain may comprise one or more silicon-bonded alkenyl or hydride functional groups, the silicon-bonded alkenyl or hydride functional groups may have linear or branched structure. The alkenyl functional silicone polymer contains preferably vinyl groups. Non-limiting examples of other unsaturated groups that can be employed include allyl —$CH_2CH=CH_2$ and hexenyl —$(CH2)_4CH=CH_2$. The functional silicone polymer may optionally contain hydride groups. The vinyl or hydride functional silicone polymer may comprise a polydimethylsiloxane, or a copolymer with dimethyl and (methyl, phenyl) groups, or a co-polymer with dimethyl and diphenyl groups. The (phenyl, methyl) silicone vinyl or hydride polymer may contain between 0 to 50% by weight of phenyl groups. The vinyl or hydride containing (phenyl,methyl) silicone may contain between 0 to 5% by weight of phenyl groups, or 5 to 10% by weight of phenyl groups, or 10 to 15% by weight of phenyl groups, or 15 to 20% by weight of phenyl groups, or 20 to 25% by weight of phenyl groups, or 25 to 30% by weight of phenyl groups, or 30 to 35% by weight of phenyl groups, or 35 to 40% by weight of phenyl groups, or 40 to 45% by weight of phenyl groups, or 45 to 50% by weight of phenyl groups. The remaining groups on the polymer may comprise methyl groups. The refractive index of said silicon vinyl or hydride polymer (in the absence of the nanocrystals) may be between 1.41 to 1.45, or between 1.45 and 1.47, or between 1.47 and 1.49, or between 1.49 and 1.51, or between 1.51 and 1.53, or between 1.53 and 1.55. The weight average molecular weight of said silicon vinyl or hydride polymer may be in the range of 100 to 100,000 Daltons (D), or in the range of 50,000 to 75,000 D, or in the range of 25,000 to 50,000 D, or in the range of 15,000 to 25,000 D, or in the range of 10,000 to 15,000 D, or in the range of 5,000 to 10,000 D, or in the range of 2,500 to 5,000 D, or in the range of 1,000 to 2,500 D, or in the range of 100 to 1,000 D. Said silicon vinyl or hydride polymer may comprise a single material or a combination of two or more functional silicon polymers that differ in at least one of the following properties: structure, viscosity, average molecular weight, siloxane units, and sequence.

The present disclosure provides process of making presently disclosed solvent-free silicone nanocomposite comprising mixing the capped nanocrystals directly into silicones, including silicone monomers, polymers or mixtures there-of, such as the vinyl containing siloxane or silicone at a 5-10 percent by wt ratio, or in the range of 10-15 percent by weight ratio, or in the range of 15-20 percent by weight ratio, or in the range of 20-25 percent by weight ratio, or in the range of 25-30 percent by weight ratio, or in the range of 30-35 percent by weight ratio, or in the range of 35-40 percent by weight ratio, or in the range of 40-45 percent by weight ratio, or in the range of 45-50 percent by weight ratio, or in the range of 50-55 percent by weight ratio, or in the range of 55-60 percent by weight ratio, or in the range of 60-65 percent by weight ratio, or in the range of 65-70 percent by weight ratio, or in the range of 70-75 percent by weight ratio, or in the range of 75-80 percent by weight ratio, or in the range of 80-85 percent by weight ratio, or in the range of 85-90 percent by weight ratio, or in the range of 90-95 percent by weight ratio, and mixing the mixture by mechanical agitation, such as a speed mixer, until a homogeneous transparent mixture is obtained. The viscosity of the resultant solvent free nanocrystal dispersion can be in the range of 50,000-100,000 cP, or in the range of 25,000-50,000 cP, or in the range of 10,000-25,000 cP, or in the range of 1,000-10,000 cP, or in the range of 900-1,000 cP, or in the range of 800-900 cP, or in the range of 700-800 cP, or in the range of 600-700 cP, or in the range of 500-600 cP, or in the range of 400-500 cP, or in the range of 300-400 cP, or in the range of 200-300 cP, or in the range of 100-200 cP, or in the range of 75-100 cP, or in the range of 50-75 cP, or in the range of 25-50 cP, or in the range of 10-25 cP, or in the range of 1-10 cP.

The present disclosure provides process of making presently disclosed solvent-free silicone nanocomposite comprising mixing the capped nanocrystals directly into silicones, including silicone monomers, polymers or mixtures there-of, such as a hydride containing siloxane or silicone at a 5-10 percent by wt ratio, or in the range of 10-15 percent by weight ratio, or in the range of 15-20 percent by weight ratio, or in the range of 20-25 percent by weight ratio, or in the range of 25-30 percent by weight ratio, or in the range of 30-35 percent by weight ratio, or in the range of 35-40 percent by weight ratio, or in the range of 40-45 percent by weight ratio, or in the range of 45-50 percent by weight ratio, or in the range of 50-55 percent by weight ratio, or in the range of 55-60 percent by weight ratio, or in the range of 60-65 percent by weight ratio, or in the range of 65-70 percent by weight ratio, or in the range of 70-75 percent by weight ratio, or in the range of 75-80 percent by weight ratio, or in the range of 80-85 percent by weight ratio, or in the range of 85-90 percent by weight ratio, or in the range of 90-95 percent by weight ratio, and mixing the mixture by mechanical agitation, such as a speed mixer, until a homogeneous mixture is obtained. The homogeneous mixture comprises transparent mixture. The viscosity of the resultant solvent free nanocrystal dispersion can be in the range of 50,000-100,000 cP, or in the range of 25,000-50,000 cP, or in the range of 10,000-25,000 cP, or in the range of 1,000-10,000 cP, or in the range of 900-1,000 cP, or in the range of 800-900 cP, or in the range of 700-800 cP, or in the range of 600-700 cP, or in the range of 500-600 cP, or in the range of 400-500 cP, or in the range of 300-400 cP, or in the range of 200-300 cP, or in the range of 100-200 cP, or in the range of 75-100 cP, or in the range of 50-75 cP, or in the range of 25-50 cP, or in the range of 10-25 cP, or in the range of 1-10 cP.

The present disclosure provides an alternative process of making presently disclosed solvent-free silicone nanocomposite or nanocrystal dispersion comprising suspending the capped nanocrystals in a nonpolar solvent such as toluene, xylene, hexanes, heptanes, or mixture thereof, between 5-10 percent by weight, or in the range of 10-15 percent by weight, or in the range of 15-20 percent by weight, or in the range of 20-25 percent by weight, or in the range of 25-30 percent by weight, or in the range of 30-35 percent by weight, or in the range of 35-40 percent by weight, or in the range of 40-45 percent by weight, or in the range of 45-50 percent by weight, or in the range of 50-55 percent by weight, or in the range of 55-60 percent by weight, or in the range of 60-65 percent by weight, or in the range of 65-70 percent by weight, or in the range of 70-75 percent by weight, or in the range of 75-80 percent by weight, or in the range of 80-85 percent by weight, or in the range of 85-90 percent by weight adding presently disclosed silicones, such as a silicone vinyl polymer to the suspension at 5 to 10 percent by weight, or in the range of 10-15 percent by weight, or in the range of 15-20 percent by weight, or in the range of 20-25 percent by weight, or in the range of 25-30 percent by weight, or in the range of 30-35 percent by weight, or in the range of 35-40 percent by weight, or in the range of 40-45 percent by weight, or in the range of 45-50 percent by weight, or in the range of 50-55 percent by weight, or in the range of 55-60 percent by weight, or in the range of 60-65 percent by weight, or in the range of 65-70 percent by weight, or in the range of 70-75 percent by weight, or in the range of 75-80 percent by weight, or in the range of 80-85 percent by weight, or in the range of 85-90 percent by weight, or in the range of 90-95 percent by weight of the nanocrystals; blending the mixture at room temperature or at an elevated temperature to achieve a visually clear and homogeneous mixture followed by the solvent removal/flash-off to provide a solvent free silicone nanocomposite or nanocrystal dispersion.

Figure 9:
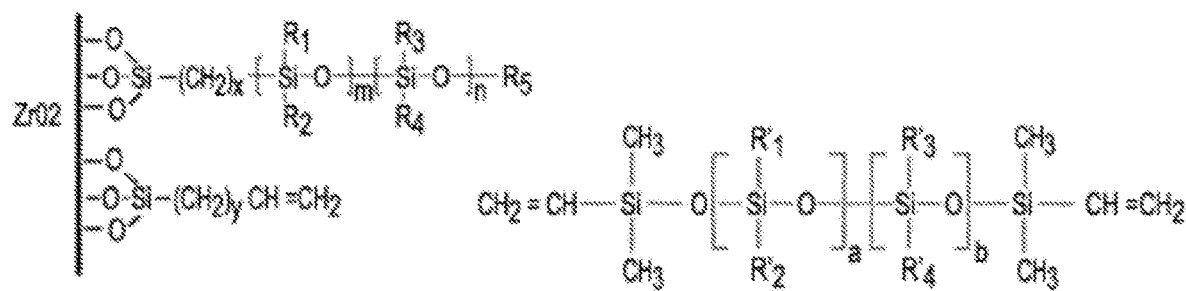

An exemplary scheme for route-1 is direct dispersion of nanocrystals capped with at least the silicone capping agent, into a vinyl containing siloxane or silicone. The Silicone capping agent on the surface of ZrO2 nanocrystals comprise a capping agent comprising a dimethyl silicone, $(MeO)_3SiO-(CH_2)n-(Si(Me)_2O)x-Si(Me_2)C_4H_9$, with x optionally of 1 to 10, 11 to 20, 21 to 30, 31 to 40, 41 to 50, 51 to 60, 61 to 70, 71 to 80, 81 to 90 or 91 to 100, and; n=0-10, 0-4, 2-3. Nanocrystals can optionally additionally comprise functional capping agents, such as vinyl trimethoxysilane or nonfunctional capping agents such as methyltrimethoxysilane. FIG. 9 is a schematic description of a dispersion of zirconia nanocrystals capped with a silicone capping agent and a functional capping agent dispersed in a vinyl containing silicone.

An exemplary scheme for route-1 is direct dispersion of nanocrystals capped with at least the silicone capping agent, into a hydride containing siloxane or silicone. The Silicone capping agent on the surface of ZrO2 nanocrystals comprise a capping agent comprising a dimethyl silicone, $(MeO)_3SiO-(CH_2)n-(Si(Me)_2O)x-Si(Me_2)C_4H_9$, with x optionally of 1 to 10, 11 to 20, 21 to 30, 31 to 40, 41 to 50, 51 to 60, 61 to 70, 71 to 80, 81 to 90 or 91 to 100, and; n=0-10, 0-4, 2-3. Nanocrystals can optionally additionally comprise functional capping agents, such as vinyl trimethoxysilane or nonfunctional capping agents such as methyltrimethoxysilane.

Route-2

Figure 10:
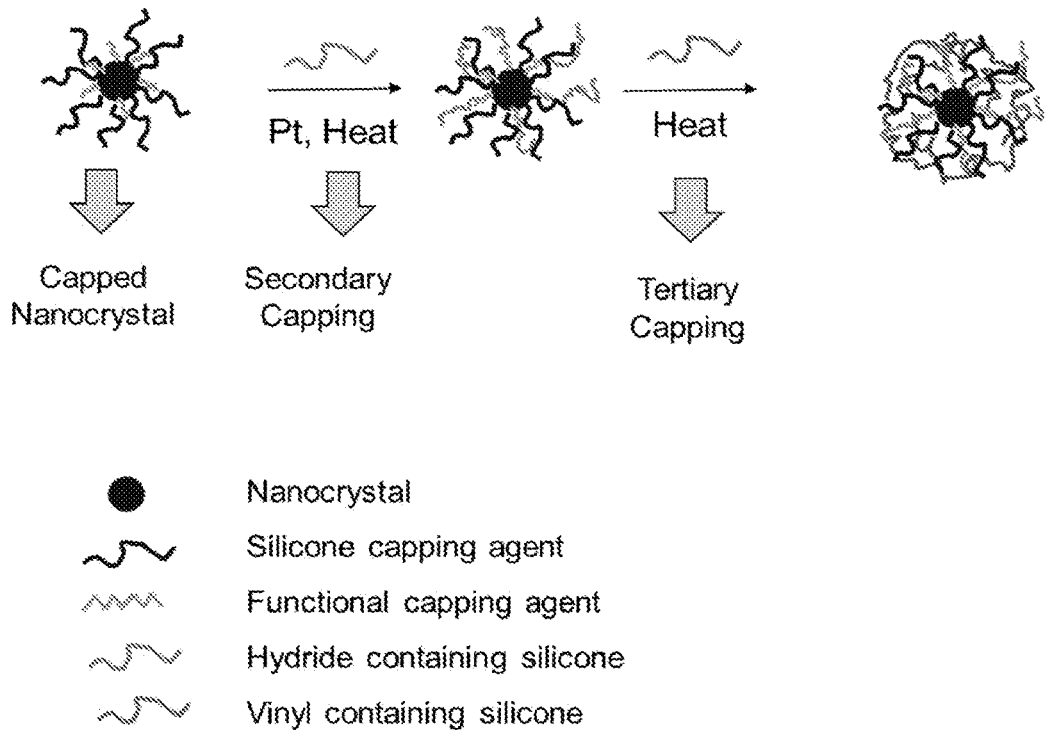

Route 2 provides another method of dispersing capped nanocrystals in a silicone matrix. The capped nanocrystals comprise at least one type of functional groups, such as alkenyl groups including vinyl groups or allyl groups. Functional silicones are then grafted on the capped nanocrystals by the reaction of, for example, the alkenyl groups on the surface of the nanocrystals and the hydride groups of the silicones in the presence of a catalyst for improved compatibility with the desired silicones that they are dispersed in. The capped nanocrystals are first dispersed in a solvent and a hydride containing silicone is added to the mixture. The grafting reaction is named as a secondary capping reaction with the grafted silicones as a secondary capping agent. Optionally, a tertiary capping reaction may be carried out subsequently to further modify the surface of the nanocrystals by increasing the silicone chain length. The reaction can be, for example reacting a vinyl containing silicone, a tertiary capping agent, with the silicone hydride of the secondary capping agents after the secondary capping reaction through a hydrosilylation reaction in the presence of Pt catalyst, as shown in FIG. 10. The capping reactions can be carried out in a solvent or a mixture of solvents which can subsequently be removed by vacuum drying or flash off after dispersion of the capped nanocrystals in a desired silicone or a mixture of silicones.

An example of dispersion of nanocrystals using Route 2 is described herein. The nanocrystals are capped with at least one type of silicone capping agent and at least one type of functional capping agents and dispersed in a solvent or low molecular weight silicones. Low molecular weight silicones include linear and cyclic as well as volatile and non-volatile alkyl and aryl siloxanes, represented by formula $R_3SiO(R_2SiO)_fSiR_3$ where R can be alkyl groups with 1-20 carbon atoms or aryl groups such as phenyl. The value of f is 0 to about 100. These values should be selected to provide polysiloxanes with a viscosity generally not greater than about 10,000 centistokes, preferably less than 5000 centistokes, more preferable less than 2000 centistokes, more preferable less than 200 centistokes, more preferable less than 20 centistokes and with a molecular weight of less than about 500 or a molecular weight of less than about 1000.

Before dispersion of the capped nanocrystals in the vinyl containing siloxane or silicone, the nanocrystals are further surface modified in the presence of a catalyst with a hydride containing silicone having a structure R'$_0$—(Si(R'1R'2)-O)a-(Si(R'3R'4)-O)b-R'5, R'0, R'1, R'2, R'3, R'4, and R'5 may independently comprise $C_nH_{2n+1}$, where n may equal to 0 to 5, aromatic (phenyl containing) groups with $C_{6-30}$ carbon atoms. 'a' and 'b' can be 0-100. At least one of R'0, R'1, R'2, R'3, R'4, or R'5 being a hydride. The catalyst comprising a Pt catalyst. The mixture is optionally heated at 60-120 C for 10-500 min after the catalyst addition. Finally, the further functionalized nanocrystals are mixed with the vinyl containing siloxane or silicone. The mixture is optionally heated at 60-120 C for 10-500 min for dispersion.

Figure 11:
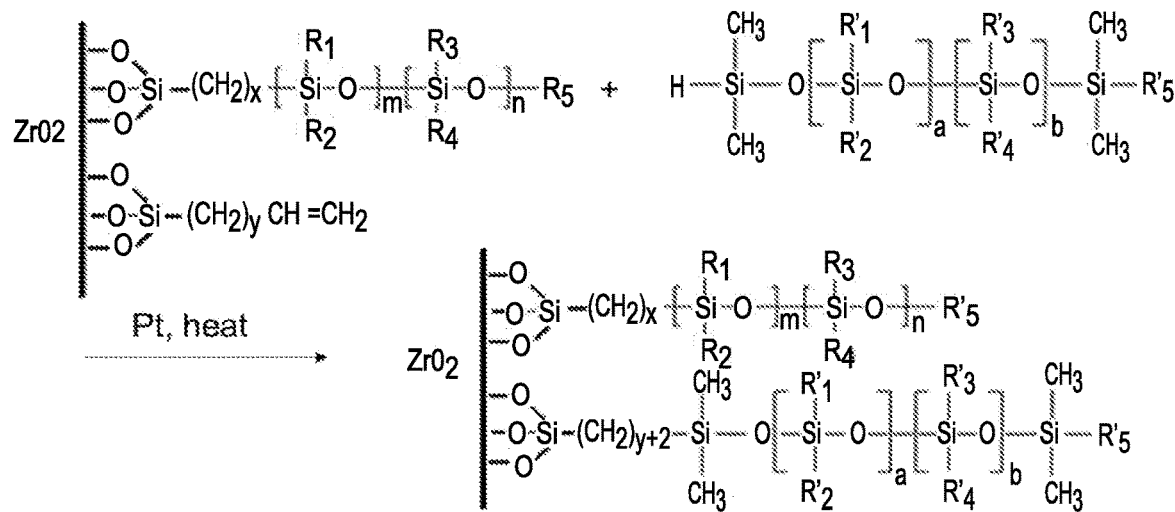
FIG. 11. An exemplary secondary capping on capped zro2

An exemplary scheme for secondary capping reaction is shown in FIG. 11.

In FIG. 11, the presently disclosed non-functional capping agent (MeO)3Si(CH2)x(Si(R1, R2)O)m-(Si(R3,R4)O)n-R5 on ZrO2 nanocrystal may comprise of one or more silicon-bonded trialkoxysilyl groups and the non-functional capping agent may have linear or branched structure with the value for 'x' varying in the range of 1-18, 'y' of 0-10. The presently disclosed vinyl functional capping agent on the nanoparticle undergoes a hydrosilylation reaction with a hydride functional silicones in the presence of a catalyst. The presently disclosed hydride functional silicone polymer chain may comprise one or more silicon-bonded hydrogen atoms, the silicon-bonded hydrogen atoms may have linear or branched structure. The silicone polymer may comprise a polydimethylsiloxane, or a copolymer with dimethyl and (methyl, phenyl) groups, or a co-polymer with dimethyl and diphenyl groups. The (phenyl,methyl) silicone hydride may contain between 0 to 5% by weight of phenyl groups, or 5 to 10% by weight of phenyl groups, or 10 to 15% by weight of phenyl groups, or 15 to 20% by weight of phenyl groups, or 20 to 25% by weight of phenyl groups, or 25 to 30% by weight of phenyl groups, or 30 to 35% by weight of phenyl groups, or 35 to 40% by weight of phenyl groups, or 40 to 45% by weight of phenyl groups, or 45 to 50% by weight of phenyl groups. The remaining groups on the polymer may comprise methyl groups. The refractive index of said silicon hydride polymer (in the absence of the nanocrystals) may be between 1.42 to 1.45, or between 1.45 and 1.47, or between 1.47 and 1.49, or between 1.49 and 1.51, or between 1.51 and 1.53, or between 1.53 and 1.55. The weight average molecular weight of said silicon hydride may be in the range of 100 to 1,000 Daltons (D), or in the range of 1,000 to 2,500 D, or in the range of 2,500 to 5,000 D, or in the range of 5,000 to 10,000 D, or in the range of 10,000 to 15,000 D, or in the range of 15,000 to 25,000 D, or in the range of 25,000 to 50,000 D, or in the range of 50,000 to 75,000 D. Said silicon hydride polymer may comprise a single material or a combination of two or more silicon hydride polymers that differ in at least one of the following properties: structure, viscosity, average molecular weight, siloxane units, and sequence.

The presently disclosed vinyl functional silicone polymer chain may comprise one or more silicon-bonded vinyl functional groups, the silicon-bonded vinyl functional groups may have linear or branched structure. The vinyl functional silicone polymer contains unsaturated groups, preferably vinyl groups. Non-limiting examples of other unsaturated groups that can be employed include allyl —CH$_2$—CH=CH$_2$ and hexenyl —(CH2)$_4$—CH=CH$_2$. The vinyl functional silicone polymer may comprise a polydimethylsiloxane, or a copolymer with dimethyl and (methyl, phenyl) groups, or a co-polymer with dimethyl and diphenyl groups. The (phenyl,methyl) silicone vinyl polymer may contain between 0 to 5% by weight, or 5 to 10% by weight, of phenyl groups, or 10 to 15% by weight, of phenyl groups, or 15 to 20% by weight, of phenyl groups, or 20 to 25% by weight, of phenyl groups, or 25 to 30% by weight, of phenyl groups, or 30 to 35% by weight, of phenyl groups, or 35 to 40% by weight, of phenyl groups, or 40 to 45% by weight, of phenyl groups, or 45 to 50% by weight, of phenyl groups. The remaining groups on the polymer may comprise methyl groups. The refractive index of said silicon vinyl polymer (in the absence of the nanocrystals) may be between 1.42 to 1.55, or between 1.45 and 1.55, or between 1.47 and 1.55, or between 1.49 and 1.55, or between 1.51 and 1.55, or between 1.53 and 1.55. The weight average molecular weight of said silicon vinyl polymer may be in the range of 100 to 100,000 Daltons (D), or in the range of 100 to 75,000 D, or in the range of 100 to 50,000 D, or in the range of 100 to 25,000 D, or in the range of 100 to 15,000 D, or in the range of 100 to 10,000 D, or in the range of 100 to 5,000 D, or in the range of 100 to 2,500 D, or in the range of 100 to 1,000 D. Said silicon vinyl polymer may comprise a single material or a combination of two or more silicon vinyl polymers that differ in at least one of the following properties: structure, viscosity, average molecular weight, siloxane units, and polymer sequence. In the presence of a catalyst, generally a platinum complex, silicone hydride adds to the vinyl group, to create an ethylene linkage. The principles of this chemistry are well-known to those skilled in the art. This chemistry is adapted in a number of ways for specific polymer systems. The substituents can be varied to achieve an appropriate degree of compatibility with the matrix resin. The molecular weight and amount of reactive groups are varied in order to achieve the desired cross-link density. Finally, the ratio of nanoparticles to the silicone polymer is varied to provide an overall nanoparticle weight loading between 5-10 weight percent, or in the range of 10-15 weight percent, or in the range of 15-20 weight percent, or in the range of 20-25 weight percent, or in the range of 25-30 weight percent, or in the range of 30-35 weight percent, or in the range of 35-40 weight percent, or in the range of 40-45 weight percent, or in the range of 45-50 weight percent, or in the range of 50-55 weight percent, or in the range of 55-60 weight percent, or in the range of 60-65 weight percent, or in the range of 65-70 weight percent, or in the range of 70-75 weight percent, or in the range of 75-80 weight percent, or in the range of 80-85 weight percent, or in the range of 85-90 weight percent, or in the range of 90-95 weight percent in the silicone matrix.

Alternatively, both the hydride functional group and unsaturated vinyl functional group are suitable silicones that can be employed. Commercial examples of such silicones are DMS-HV15 and DMS-HV22 (Gelest, USA).

An exemplary non-limiting process of making a solvent-free silicone nanocomposite comprising suspending the capped nanocrystals in a nonpolar solvent such as toluene or xylene between 20-80 percent by weight; adding presently disclosed silicon hydride polymer to the suspension at 1 to 90 weight percent of the nanocrystals to the total weight; adding the platinum catalyst between 1 to 100 ppm to the mixture, blending the mixture at room temperature, heating at an elevated temperature of 40 to 150 C range to complete the hydrosilylation reaction, followed by adding presently disclosed vinyl containing silicone polymer to the suspension at 1 to 90 weight percent of the nanocrystals to the total weight and mixing and optionally heating the mixture to achieve a visually clear and homogeneous mixture and solvent flash-off to provide a solvent free silicone dispersion or a nanocomposite.

Alternatively, the nanocrystals can be washed after secondary capping process to remove unreacted secondary capping agents by precipitation of the nanocrystals with polar solvent, such as methanol, ethanol or the mixture thereof, and re-disperse in non-polar solvent, such as toluene, hexanes, heptanes or the mixture thereof, optionally repeating the washing process to further purify the nanocrystal dispersion. The solvents can then be removed to get dried nanocrystals by vacuum drying or flash off. The dried nanocrystals can be dispersed into silicones, including silicone monomers, polymers or mixtures there-of directly with mechanical agitation, as described in Route 1. Alternatively, solvents can be used to assist the dispersion process by first dispersing the dried nanocrystal in a nonpolar solvent such as toluene, xylene, hexanes, heptanes, or mixture thereof, between 20-80 percent by weight; adding presently disclosed silicones, such as a silicon vinyl polymer to the suspension at 5 to 95 percent by weight of the nanocrystals; blending the mixture at room temperature or at an elevated temperature to achieve a visually clear and homogeneous mixture followed by the solvent removal/flash-off to provide a solvent free silicone nanocomposite or nanocrystal dispersion.

Optionally it may be preferable to use more than one type of vinyl, hydride and nonfunctional silicone polymers to further tailor the solvent free nanocomposites mechanical, and optical properties. The additional silicone polymers can be sequentially added to the process steps to provide a solvent free silicone nanocomposites.

Optionally it may be preferable to remove the platinum catalyst from the solvent-free silicone nanocomposite prior to solvent flash-off by the use of charcoal filtration process to ensure a high degree of transparency.

Optionally it may be preferable to deactivate the platinum catalyst by adding an inhibitor to the silicone nanocomposite prior to solvent flash-off.

Examples for Nanocrystal Capping

Figure 12:
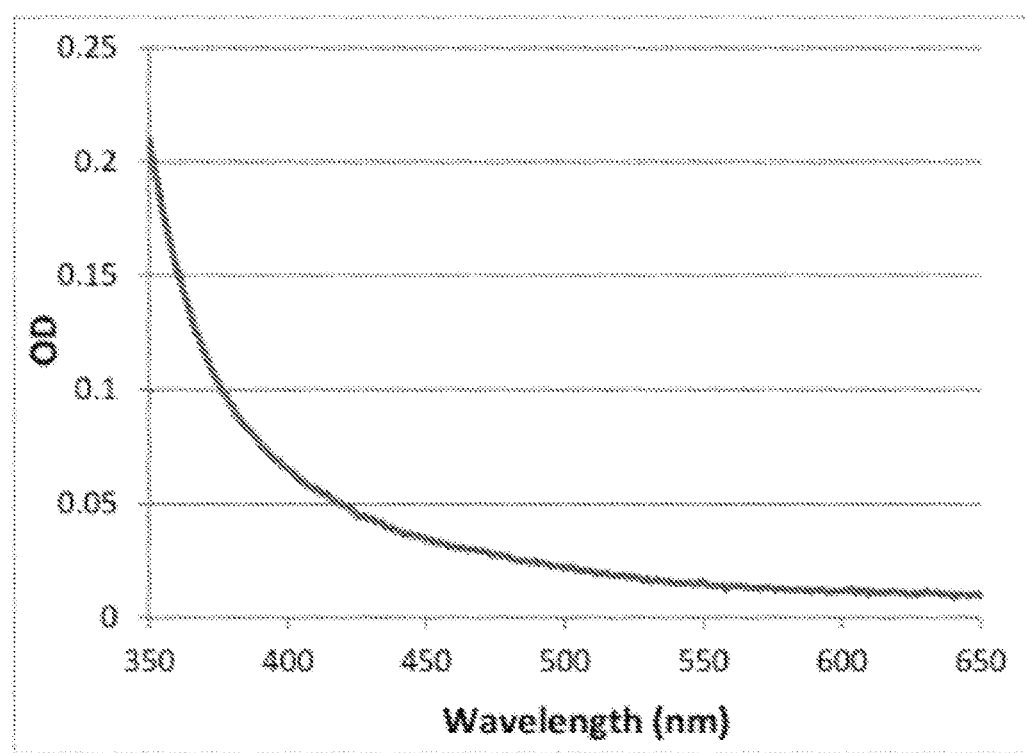
FIG. 12. Uv-vis spectrum of the capped zirconia dispersion in at 50 wt % in heptane. Selected uv-vis values are as follows.

In an example of capping nanocrystals with the silicone capping agent as described in FIG. 7, wherein R, R1, R2, R3 and R4=CH3, R5=Si(CH3)2(C4H9), m+n=10-15, and x=2; the siloxane capping agent is injected into a reaction vessel (typically a round bottom flask) containing as-synthesized nanocrystals in a nonpolar solvent, like toluene or heptane; the nanocrystals may comprise ZrO2 nanocrystals. Typically, 30 g of the capping agent is added to a round bottom flask which holds the reaction mixture containing 60 g of as-synthesized ZrO2 nanocrystals in 100 ml toluene. During the addition of the capping agent the mixture is stirred continuously. The suspension is heated to 105° C. and kept at that temperature while continuing to stir for 40 minutes. The second capping agent that is the vinyl containing capping agent, 1 g of vinyltrimethoxylsilane or 1 g of Allyltrimethoxy silane, is then injected into the reaction vessel. The mixture is kept at 105° C. and kept stirring for another 30 min. Afterwards, the mixture is allowed to cool to 70° C. and optionally, 1 g of de-ionized water is added into the mixture. The reaction is kept at 70° C. for 30 min, and then cooled down to room temperature. The product mixture is washed with ethanol and the precipitate is collected. The precipitate is dried under vacuum and dispersed in a solvent, such as hexane, heptane, toluene or xylene. FIG. 12 shows the UV-Vis spectrum of the nanocrystals dispersed in heptane with 50 wt % loading. The organic content for these capped ZrO2 is 13.32%, which is calculated by equation 1 with TGA data:

Organic content=(1−(% Mass at 700 C/% Mass at 200 C))*100%   Equation 1, as shown in FIG. 13. The organic content of the nanocrystals with water addition step is higher than the organic content of the nanocrystals without water addition. The size distribution of these nanocrystals is measured with dynamic light scattering instrument, Zetasizer (Nano-S-Zen 1600), as shown in FIG. 14.

EXAMPLES OF SURFACE PASSIVATION OF NANOCRYSTALS

Example 1

Figure 16:
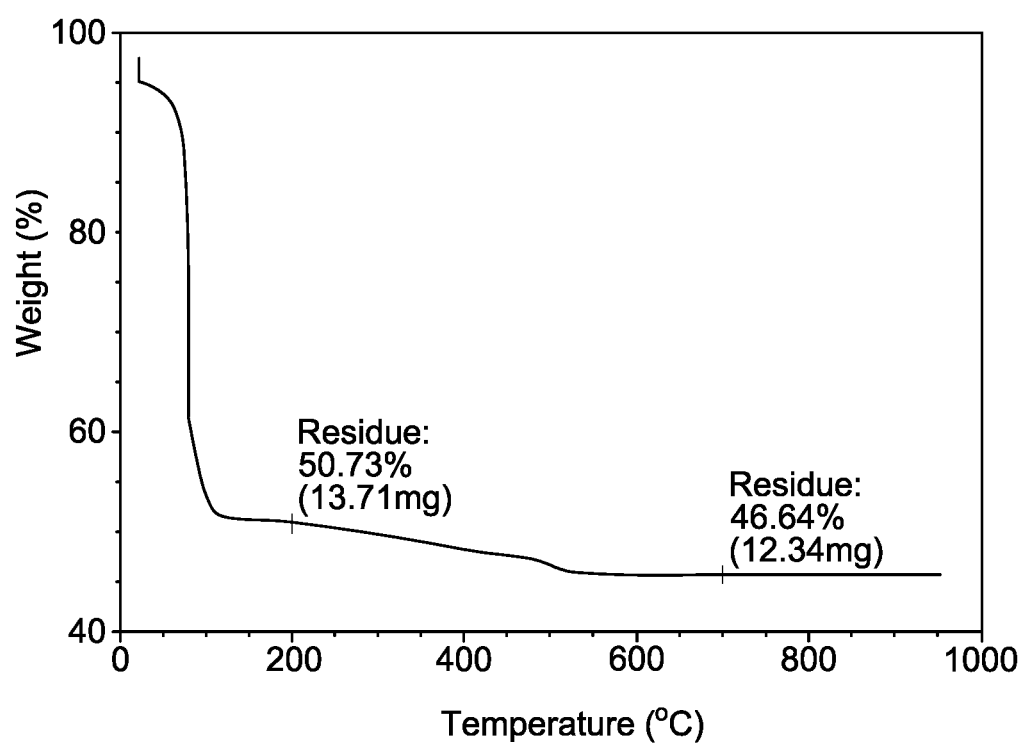

Typically, 10 g of a silicone capping agent, is added to a round bottom flask which holds the reaction mixture containing 100 g of as-synthesized ZrO2 nanocrystals in 186 g of toluene. During the addition of the capping agent the mixture is stirred continuously. The suspension is heated to 100° C. and kept at that temperature while continuing to stir for 30 minutes. The second capping agent that is the vinyl containing capping agent, 10 g of methyltrimethoxylsilane, is then injected into the reaction vessel. The mixture is kept at 100° C. and kept stirring for another 30 min. Afterwards, the mixture is allowed to cool to room temperature. The product mixture is washed with either ethanol or methanol and the precipitate is collected. The precipitate is dried under vacuum and dispersed in a solvent, such as hexane, heptane, toluene or xylene. FIG. 15 shows the UV-Vis spectrum of the nanocrystals dispersed in xylene with 50 wt % loading. The organic content for these capped ZrO2 is 10.03%, which is calculated by equation 1, as shown in FIG. 16. The size distribution of these nanocrystals is measured with dynamic light scattering instrument, Zetasizer (Nano-S-Zen 1600), as shown in FIG. 17.

Example 2

Figure 19:
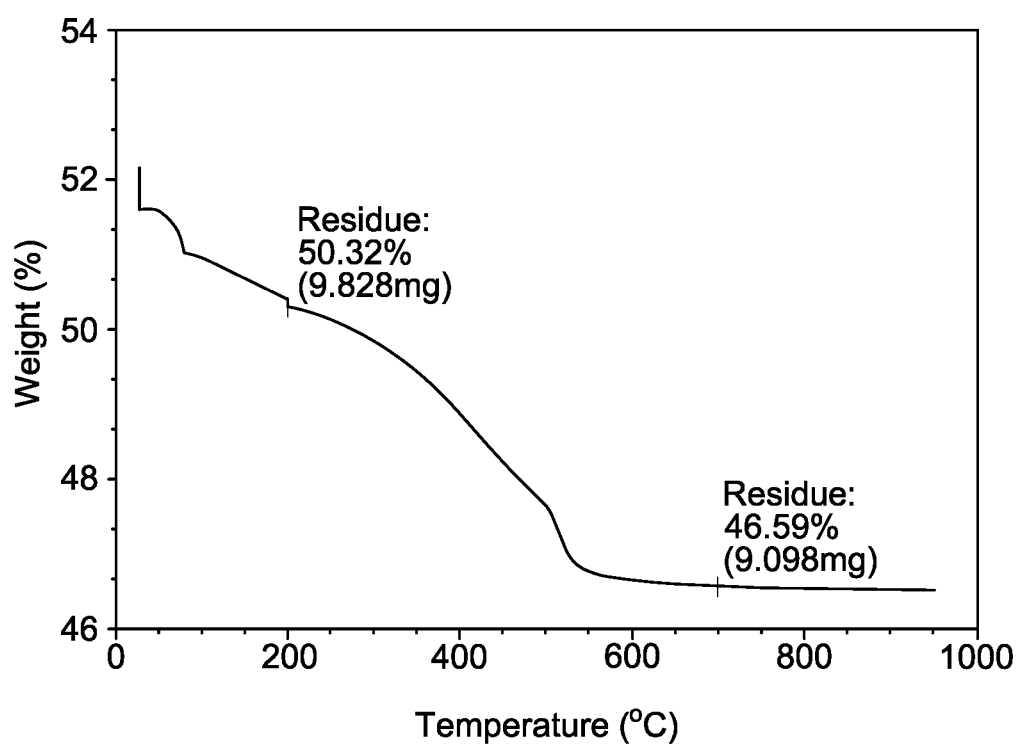

Typically, 10 g of a silicone capping agent, is added to a round bottom flask which holds the reaction mixture containing 100 g of as-synthesized ZrO2 nanocrystals in 186 g of toluene. During the addition of the capping agent the mixture is stirred continuously. The suspension is heated to 100° C. and kept at that temperature while continuing to stir for 30 minutes. The second capping agent, 10 g of methyltrimethoxylsilane, is then injected into the reaction vessel. During this time, the mixture is cooled to 70° C. with stirring over 30 min. 5 g of water is then injected into the reaction vessel. The mixture is kept at 70° C. and kept stirring for another 15 min. Afterwards, the mixture is allowed to cool to room temperature. The product mixture is washed with either ethanol or methanol and the precipitate is collected. The precipitate is dried under vacuum and dispersed in a solvent, such as hexane, heptane, toluene or xylene. FIG. 18 shows the UV-Vis spectrum of the nanocrystals dispersed in xylene with 50 wt % loading. The organic content for these capped ZrO2 is 7.41%, which is calculated by equation 1 with TGA data as shown in FIG. 19. The size distribution of these nanocrystals is measured with dynamic light scattering instrument, Zetasizer (Nano-S-Zen 1600), as shown in FIG. 20.

Example 3

Typically, 0.5 g of hexamethyldisilazane is added to a round bottom flask which holds the reaction mixture containing 5 g of silicone capped ZrO2 nanocrystals in 5 g of xylene. During the addition of the capping agent the mixture is stirred continuously. The suspension is heated to 50° C. and kept at that temperature while continuing to stir for 180 minutes. After cooling to room temperature, the solvent is removed under vacuum and the product dispersed in a solvent, such as hexane, heptane, toluene or xylene. Treatment with hexamethyldisilazane was repeated three additional times. The organic content for these capped ZrO2 is 11.87%, which is calculated by equation 1 with TGA data, as shown in FIG. 21.

Example 4

Typically, 2.5 g of benzoic acid is added to a round bottom flask which holds the reaction mixture containing 25 g of silicone capped ZrO2 nanocrystals in 25 g of xylene. During the addition of the capping agent the mixture is stirred continuously. The suspension is kept at room temperature while continuing to stir for 24 hours. The product mixture is washed with methanol and the precipitate is collected. The precipitate is dried under vacuum and dispersed in a solvent, such as hexane, heptane, toluene or xylene. The organic content for these capped ZrO2 is 14.67%, which is calculated by equation 1 with TGA data as shown in FIG. 22.

Example 5

Typically, 0.07 g of Eversorb 93 is added to a round bottom flask which holds the reaction mixture containing 6 g of silicone capped ZrO2 nanocrystals in 6 g of xylene. During the addition of the capping agent the mixture is stirred continuously. The suspension is kept at room temperature while continuing to stir for 24 hours. No purification of this material is done and is used in this state for subsequent reactions.

Example on Solvent Free Silicone Dispersion and Nanocomposite with Route 1

In an example of making a solvent free silicone dispersion with the capped nanocrystals in PDMS at 75 wt % loading, the capped nanocrystals is mixed with PDMS, DMS-V05, (Gelest, USA) with a speed mixer. Specifically, 15 g of the capped nanocrystal and 5 g of DMS-V05 are added into a Max 20 cup (FlackTek Inc, USA). It takes 3-5 hours to obtain a good dispersion with the speed mixer (Flecktek DAC 150.1 FV-FVZ). The solvent free silicone dispersion has a viscosity of 2000 to 5000 cP at room temperature. The change of viscosity is less than 15% in two months. The viscosity is measured by Brookfield viscometer (RVDV–II+ Pro).

Solvent-Free Silicone Nanocomposite to Make Led Encapsulants

The present disclosure provides an exemplary non-limiting light emitting device that may comprise presently disclosed solvent free dispersions of metal oxide nanocrystals in vinyl containing siloxanes or silicones and a hydride containing silicone to form a nanocomposite by thermal curing of the final mixture in the presence of a Pt catalyst.

Example on Thermally Cured Silicone Nanocomposite Formulation with Route 1

In an example of making thermally cured silicone nanocomposite with 70 wt % loading of the capped nanocrystals, three-part silicone kit has been developed. The kit includes Part A, Part B and Pt catalyst.

Part A: 75 wt % ZrO2 in vinyl containing PDMS, DMS-V05 (Gelest, USA)

To prepare Part A, mix 12 g of the capped ZrO2 with 4 g of DMS-V05 with Speed mixer.

Part B: Hydride containing PDMS, HMS 301(Gelest, USA)

Pt Catalyst solution: platinum-divinyltetramethyldisiloxane complex (SIP6830.3, Gelest, USA) diluted with a silicone oil (DMS-T05, Gelest, USA) at a concentration of 700 ppm.

The three parts are mixed together with speed mixer for 1 minute at 2600 rpm. The mixing ratio of Part A to Part B is 10 to 1. The Pt catalyst concentration is 1-5 ppm. The mixture can be cured by baking the films on a hot plate at 40° C./1 h, 60° C./1 h and then 100° C./1 h sequentially.

The cured nanocomposite films have a hardness of Shore A45 measured with a Durometer. Films with a thickness of 110 microns made with such formulation have an optical transmittance above 95% from 400-800 nm.

The refractive index of the nanocomposite film is 1.54 at 450 nm, an increase of 0.12 comparing to the base PDMS (FIG. 23).

No cracking or discoloring is observed for the base polymer and nanocomposite films with a thickness of 100 to 120 micrometer after solder reflow thermal treatment, as shown in FIG. 24. Heating profile for solder reflow heat treatment is shown in FIG. 25.

Example on Solvent Free Silicone Dispersion and Nanocomposite with Route 2

In an example of making a solvent free silicone dispersion with the capped nanocrystal in a polymethylphenylsilicone, PMPS, at 70 wt % loading, the nanocrystals are reacted with hydride containing PMPS, a secondary capping agent, and subsequently reacted with vinyl containing PMPS with a molecular weight of 100 to 10,000, a tertiary capping agent or the PMPS to be dispersed in. Specifically, 1. The capped ZrO2 nanocrystals, as described in EXAMPLES FOR NANOCRYSTAL CAPPING, are dispersed into xylene at 50% loading. The secondary capping agent, HPM-502 (Gelest, USA) and tertiary capping agent or the PMPS to be dispersed in with a molecular weight of 100 to 10,000 are diluted with xylene separately to make 50% solutions each.

2. The secondary capping agent solution is added into the nanocrystal dispersion at an exemplary weight ratio of nanocrystal to capping agent of 20:1. The mixture is stirred at 90 C for 30 min in the presence of Pt catalyst at a concentration of 10 ppm.

3. The vinyl containing silicone solution is added into the above mixture. The amount of the silicone is calculated to achieve a nanocrystal solid loading of about 70%. The mixture is stirred at 90 C in an oil bath.

4. The mixture is cooled down to room temperature. Optionally, the Pt catalyst is removed by charcoal filtration while the solvent is subsequently removed by vacuum.

Figure 27:
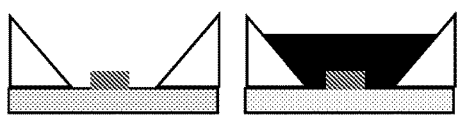

FIG. 26 shows the dispersions of the capped ZrO2 nanocrystals in a vinyl containing silicone at 70 wt % solid loading before (a) and after (b) solvent removal Phosphor-deposited layers are applied often by dispensing a material into cavity-type LED packages under controlled pressures and dispense times (FIG. 27). These LED packages are ideal for this dispense process since they can contain the dispensed fluid within the cavity.

Figure 28:
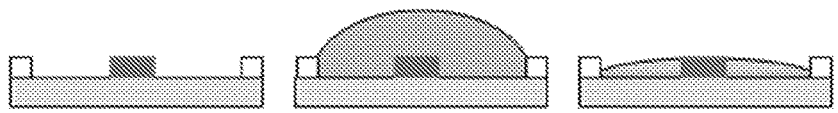

Another LED package that is appropriate for dispense applications contains small dams that surround the LED chip to prevent fluid flow off of the substrate (FIG. 28). The phosphor-deposited material before cure naturally forms a nearly hemispherical shape because of surface tension of the fluid in combination with the dams.

Solvent-free phosphor-deposited materials are preferred for both of these dispensing techniques. In both cases solvent could be evaporated away from the material prior to or during cure, but a few problems can arise:

1. A solvent-removal step can be time-intensive and is typically not preferred for most dispense processes.

2. Solvent-containing materials often have very low viscosities and low surface tensions and may not yield the preferred curved shape shown in the picture.

3. Due to low viscosities and long solvent evaporation times, phosphor settling can occur in the phosphor-deposited layer before final cure. Severe phosphor settling and non-uniformity can lead to reduced light output and undesired color points.

4. Solvent can give rise to air bubbles and voids upon heat-curing of the material The solvent-free zirconia-silicone nanocomposite material, thus, allow dispensed phosphor-deposited layers to be formed with high-refractive index.

Example on Dispensing Solvent-Free Silicone Nanocomposite Containing Phosphor

An example of dispensing a phosphor-deposited layer of silicone nanocomposite with 70 wt % loading is described herein. Once the three solvent-free components (Part A, Part B and Pt Catalyst) have been added accordingly together, phosphor particles can be added in various weight ratios to achieve the desired color temperature for a given LED package. This mixture is then dispensed and cured to form a high refractive index nanocomposite.

Application for Spraying Phosphor-Deposited Layer onto Led Chip with Small Addition of Solvent to Solvent-Free Nanocomposite Material For typical spray processes a fairly low viscosity (e.g. 10-100 cP) is required under standard applied pressures. Many commercially-available silicones possess high viscosities (e.g. >1000 cP). A chosen silicone of known viscosity is usually diluted with solvent and phosphor material is added such that an appropriate final viscosity is obtained. Solvent and phosphor amounts are optimized with properly-chosen spray conditions to reduce phosphor settling prior to the spray step.

The solvent-free zirconia-silicone nanocomposite has a viscosity less than 1000 cP and alone is not suitable for spray process. By treating the nanocomposite as a standard silicone product, solvent could be added to an appropriate level (e.g. <20 wt %) such that a high-refractive index phosphor-deposited layer can be applied at the desired color temperature and with minimal phosphor settling.

Application for Spin-Coating an Optical Film onto Substrates with Small Addition of Solvent to Solvent-Free Nanocomposite Material For typical spin-coating processes a fairly low viscosity (e.g. 10-100 cP) is required under standard rotational speeds. Many commercially-available silicones possess high viscosities (e.g. >1000 cP). A chosen silicone of known viscosity is usually diluted with solvent until an appropriate final viscosity is obtained. Solvent amounts, rotational speeds, acceleration rates to set speed and spin times are optimized to yield bubble-free films of desired thicknesses.

The three part solvent-free zirconia-silicone nanocomposite has a viscosity less than 1000 cP after mixing and alone is not suitable for spin-coating. By treating the nanocomposite as a standard silicone product, solvent could be added to an appropriate level such that a high-refractive index optical film can be applied to a given substrate.

Application for Slot-Die Coating of Solvent-Free Nanocomposite Material

For slot-die coating processes a fairly low viscosity (e.g. 5-500 cP) is required under applied pressures and translational speeds. Many commercially-available silicones possess high viscosities (e.g. >1000 cP). A chosen silicone of known viscosity is usually diluted with solvent until an appropriate final viscosity is obtained. Solvent amounts, rotational speeds, acceleration rates to set speed and spin times are optimized to yield bubble-free films of desired thicknesses.

The three part solvent-free zirconia-silicone nanocomposite has a viscosity less than 1000 cP after mixing and alone is not suitable for slot-die coating. By treating the nanocomposite as a standard silicone product, solvent could be added to an appropriate level such that a high-refractive index optical film can be applied to a given substrate.

Application For Making Molded Lenses From Solvent-Free Nanocomposite with High-Refractive Index For many LED packages a lens, either hemispherical or cubic, are typically molded directly or adhered to the phosphor-deposited layer which lies on top of the LED chip. The benefit of a high-refractive index (e.g. >1.6) phosphor-deposited layer on top of the LED is clear, allowing better light extraction from the LED. Additional light output can occur by adding a clear, high-refractive index (e.g. >1.5) lens on top of the phosphor-deposited layer. The geometry of the lens (for example, hemispherical or cubic) can vary with the size and chip type. Often glass lenses with the desired refractive index are adhered to the phosphor-deposited layer with a clear adhesive (typically a silicone material). The glass-lens approach has disadvantages in that lens alignment, delamination between phosphor-deposited layer and lens, and potential bubble formation under the lens can occur especially when placed manually. These problems can lead to reduced light output and a high degree of product inconsistency. A more typical and robust process for placing lenses on top of the phosphor-deposited layer is through silicone molding. This method is relatively easy to employ once key molding parameters have been established, such as, applied pressures, temperatures and hold times for a material of a given viscosity. Such molding materials are solvent-free for the main reason that solvent cannot readily escape during the molding process and would ultimate lead to air bubbles or voids present in the molded lens. Additionally, solvent-containing silicones would likely have low viscosities (e.g. <<100 cP), making molding difficult (e.g. leaking of material before cure). For the same reasons solvent-containing dispersions of nano-scale zirconia with silicone binder are not appropriate for molding applications. The three part solvent-free zirconia-silicone nanocomposite material, thus, allow molded lenses to be formed with high-refractive index.

Example on Hemispherical Lens Molding of Solvent-Free Silicone Nanocomposite

An example of molding a cured part of a hemispherical lens of silicone nanocomposite with 70 wt % loading is described herein. Once the three components (Part A, Part B and Pt Catalyst) have been added accordingly together, the mixture is added to a flexible silicone mold.

The silicone mold was made with Dow Corning Xiameter® silicone RTV-4230-E, an aluminum weigh dish and pre-made plastic hemispherical lenses (FIG. 29). The plastic lenses were placed individually into the weigh dish facing upwards, and the Xiameter® silicone was poured into the dish and over the lens. After the recommended curing time was finished, the cured silicone was removed from the dish, and the plastic lenses were separated from the mold.

The solvent-free silicone nanocomposite mixture was dispensed individually into the cavities of the silicone mold. The cavities were completed filled. The filled mold was subjected to the following cure conditions on a hotplate in order to ensure clear lenses would result (FIG. 30):

1. 40 C for 1 hour
2. 60 C for 1 hour
3. 100 C for 1 hour

Optical Property Measurement

Light propagating through a sample can be absorbed, scattered, or transmitted. The normal transmittance is defined as $T_n = I/I_0$, where $I_0$ is the power of incident light and I is the power of the light in the forward direction collected by the detector, which includes both light that is transmitted without scattering and light that is scattered into the forward direction. Theoretically the forward direction is defined as the same direction of the incident light, and however the detector usually collects light within a small solid angle around this direction due to the finite size of the detector. This transmittance is called Normal Transmittance, $T_n$, throughout this disclosure. When measuring normal transmittance, measurements artifacts, such as Fresnel reflections off of various interfaces, needs to be accounted for and removed. This can be taken care of by using a reference, either by measuring the sample and reference side by side in the instrument, or by measuring the sample and reference sequentially and then correcting the data mathematically afterward. The liquid solvent-free nanocrystal dispersion samples can be measured in a cuvette made of glass, quartz, or plastic, and due to the finite thickness of the cuvette wall, there are four interfaces where Fresnel reflections can occur. Using a cuvette with same path length as the reference will produce results with sufficient accuracy.

The Diffuse Transmittance, $T_s$, is defined as all the light power that is transmitted across the sample through scattering divided by the power of the incident light, $T_s=I_s/I_0$. Diffuse transmittance $T_s$ is usually measured using an integrating sphere where-in the forward transmitted light is blocked from reaching the detector. The Total Transmittance, T, defined as all the light power that propagates across the sample, is $T=T_n+T_s$.

Highly Loaded Dispersion with High Normal Transmittance

Embodiments of the presently disclosed solvent-free nanocrystal dispersion composition with the metal oxide (including zirconium oxide, titanium oxide, hafnium oxide, zinc oxide, yttrium oxide, and niobium oxide and/or mixtures of at least two of these and/or alloys of at least two thereof) nanocrystals include a nanocrystal loading in the range of 5 to 10 weight %, or 10 to 20 weight %, or 20 to 30 weight %, or 30 to 40 weight %, or 40 to 50 weight %, or 50 to 60 weight %, or 60 to 70 weight %, or 70 to 80 weight %, or 80 to 90 weight %; and having a refractive index in the range of 1.4 to 1.41, or 1.41 to 1.42, or 1.42 to 1.43, or 1.43 to 1.44, or 1.44 to 1.45, or 1.45 to 1.46, or 1.46 to 1.47, or 1.47 to 1.48, or 1.48 to 1.49, or 1.49 to 1.50, or 1.50 to 1.51, or 1.51 to 1.52, or 1.52 to 1.53, or 1.53 to 1.54, or 1.54 to 1.55, or 1.55 to 1.56, or 1.56 to 1.57, or 1.57 to 1.58, or 1.58 to 159, or 1.59 to 1.60, or 1.60 to 1.61, or 1.61 to 1.62, or 1.62 to 1.63, or 1.63 to 1.64, or 1.64 to 1.65, or 1.65 to 1.66, or 1.66 to 1.67, or 1.67 to 1.68, or 1.68 to 1.69, or 1.69 to 1.70, or 1.70 to 1.71, or 1.71 to 1.72, or 1.72 to 1.73, or 1.73 to 1.74, or 1.74 to 1.75, or 1.75 to 1.76, or 1.76 to 1.77, or 1.77 to 1.78, or 1.78 to 1.79, or 1.79 to 1.80, or 1.80 to 1.81, or 1.81 to 1.82, or 1.82 to 1.83, or 1.83 to 1.84, or 1.84 to 1.85, or 1.85 to 1.86, or 1.86 to 1.87, or 1.87 to 1.88, or 1.88 to 1.89, or 1.89 to 1.9 at 633 nm; and exhibit normal transmittance $T_n$ between 20% and 25%, or 25% and 30%, or 30% and 35%, and 35% and 40%, or 40% and 45%, or 45% and 50%, or 50% and 55%, or 55% and 60%, or 60% and 65%, or 65% and 70%, or 70% and 75%, or 75% and 80%, or 80% and 85%, or 85% and 90%, or 90% and 92% or 92% and 94%, or 94% and 96%, or 96% and 98%, or 98% and 99%, or 99% and 99.5%, or 99.5% and 99.9% when measured in a 1 cm cuvette at a wavelength of 300 nm, or 350 nm, or 400 nm, or 450 nm, or 500 nm, or 550 nm, or 600 nm.

Highly Loaded Dispersion with High Diffuse Transmittance

Embodiments of the presently disclosed solvent-free nanocrystal dispersion composition with the metal oxide (including zirconium oxide, titanium oxide, hafnium oxide, zinc oxide, yttrium oxide, and niobium oxide and/or mixtures of at least two of these and/or alloys of at least two thereof) nanocrystals include a nanocrystal loading in the range of 5 to 10 weight %, or 10 to 20 weight %, or 20 to 30 weight %, or 30 to 40 weight %, or 40 to 50 weight %, or 50 to 60 weight %, or 60 to 70 weight %, or 70 to 80 weight %, or 80 to 90 weight %; and having a refractive index in the range of 1.4 to 1.41, or 1.41 to 1.42, or 1.42 to 1.43, or 1.43 to 1.44, or 1.44 to 1.45, or 1.45 to 1.46, or 1.46 to 1.47, or 1.47 to 1.48, or 1.48 to 1.49, or 1.49 to 1.50, or 1.50 to 1.51, or 1.51 to 1.52, or 1.52 to 1.53, or 1.53 to 1.54, or 1.54 to 1.55, or 1.55 to 1.56, or 1.56 to 1.57, or 1.57 to 1.58, or 1.58 to 159, or 1.59 to 1.60, or 1.60 to 1.61, or 1.61 to 1.62, or 1.62 to 1.63, or 1.63 to 1.64, or 1.64 to 1.65, or 1.65 to 1.66, or 1.66 to 1.67, or 1.67 to 1.68, or 1.68 to 1.69, or 1.69 to 1.70, or 1.70 to 1.71, or 1.71 to 1.72, or 1.72 to 1.73, or 1.73 to 1.74, or 1.74 to 1.75, or 1.75 to 1.76, or 1.76 to 1.77, or 1.77 to 1.78, or 1.78 to 1.79, or 1.79 to 1.80, or 1.80 to 1.81, or 1.81 to 1.82, or 1.82 to 1.83, or 1.83 to 1.84, or 1.84 to 1.85, or 1.85 to 1.86, or 1.86 to 1.87, or 1.87 to 1.88, or 1.88 to 1.89, or 1.89 to 1.9, at 633 nm and exhibit diffuse transmittance between 75% and 70%, or 70% and 65%, or 65% and 60%, or 60% and 55%, or 55% and 50%, or 50% and 45%, or 45% and 40%, or 40% and 35%, or 35% and 30%, or 30% and 25%, or 25% and 20%, or 20% and 15%, or 15% and 10%, or 10% and 8%, or 8% and 6%, or 6% and 4%, or 4% and 3%, or 3% and 2%, or 2% and 1%, or 1% and 0.5%, or 0.5% and 0.1% when measured in a 1 cm cuvette at wavelengths of 300 nm, or 350 nm, or 400 nm, or 450 nm, or 500 nm, or 550 nm, or 600 nm.

Highly Loaded Dispersion with High Total Transmittance

Embodiments of the presently disclosed solvent-free nanocrystal dispersion composition with the metal oxide (including zirconium oxide, titanium oxide, hafnium oxide, zinc oxide, yttrium oxide, and niobium oxide and/or mixtures of at least two of these and/or alloys of at least two thereof) nanocrystals include a nanocrystal loading in the range of 5 to 10 weight %, or 10 to 20 weight %, or 20 to 30 weight %, or 30 to 40 weight %, or 40 to 50 weight %, or 50 to 60 weight %, or 60 to 70 weight %, or 70 to 80 weight %, or 80 to 90 weight %; and having a refractive index in the range of 1.4 to 1.41, or 1.41 to 1.42, or 1.42 to 1.43, or 1.43 to 1.44, or 1.44 to 1.45, or 1.45 to 1.46, or 1.46 to 1.47, or 1.47 to 1.48, or 1.48 to 1.49, or 1.49 to 1.50, or 1.50 to 1.51, or 1.51 to 1.52, or 1.52 to 1.53, or 1.53 to 1.54, or 1.54 to 1.55, or 1.55 to 1.56, or 1.56 to 1.57, or 1.57 to 1.58, or 1.58 to 159, or 1.59 to 1.60, or 1.60 to 1.61, or 1.61 to 1.62, or 1.62 to 1.63, or 1.63 to 1.64, or 1.64 to 1.65, or 1.65 to 1.66, or 1.66 to 1.67, or 1.67 to 1.68, or 1.68 to 1.69, or 1.69 to 1.70, or 1.70 to 1.71, or 1.71 to 1.72, or 1.72 to 1.73, or 1.73 to 1.74, or 1.74 to 1.75, or 1.75 to 1.76, or 1.76 to 1.77, or 1.77 to 1.78, or 1.78 to 1.79, or 1.79 to 1.80, or 1.80 to 1.81, or 1.81 to 1.82, or 1.82 to 1.83, or 1.83 to 1.84, or 1.84 to 1.85, or 1.85 to 1.86, or 1.86 to 1.87, or 1.87 to 1.88, or 1.88 to 1.89, or 1.89 to 1.9 at 633 nm; and exhibit total transmittance T between 40% and 45%, or 45% and 50%, or 50% and 55%, or 55% and 60%, or 60% and 65%, or 65% and 70%, or 70% and 75%, or 75% and 80%, or 80% and 85%, or 85% and 90%, or 90% and 92% or 92% and 94%, or 94% and 96%, or 96% and 98%, or 98% and 99%, or 99% and 99.5%, or 99.5% and 99.9% when measured in a 1 cm cuvette at a wavelength of 300 nm, or 350 nm, or 400 nm, or 450 nm, or 500 nm, or 550 nm, or 600 nm.

Highly Loaded Dispersion with High and Stable Normal Transmittance

A solvent-free metal oxide (including zirconium oxide, titanium oxide, hafnium oxide, zinc oxide, yttrium oxide, and niobium oxide and/or mixtures of at least two of these and/or alloys of at least two thereof) nanocrystal dispersion composition with a loading in the range of 5 to 10 weight %, or 10 to 20 weight %, or 20 to 30 weight %, or 30 to 40 weight %, or 40 to 50 weight %, or 50 to 60 weight %, or 60 to 70 weight %, or 70 to 80 weight %, or 80 to 90 weight %; and wherein the percent normal transmittance after 6 months of shelf life, or 12 months of shelf life, or 18 months of shelf life, or 24 months of shelf life, or 30 months of shelf life when stored in a temperature range of 3° C.-10° C. or 10° C.-25° C. decreases by 0%-5%, or by 5%-10%, or by 10%-15%, or by 15%-20%, or by 20%-25%, or by 25%-30%, or by 30%-35%, or by 35%-40%, or by 40%-45%, or by 45%-50%, or 50%-55%, or 55%-60% of the original normal transmittance as measured in a 1 cm cuvette wavelength of 300 nm, or 350 nm, or 400 nm, or 450 nm. For this example, the decrease in normal transmittance is an absolute measure, so for example, if the initial normal transmittance is 80% and it decreases by 30% the normal transmittance is then 50%.

Highly Loaded Dispersion with High and Stable Total Transmittance

A solvent-free metal oxide (including zirconium oxide, titanium oxide, hafnium oxide, zinc oxide, yttrium oxide, and niobium oxide and/or mixtures of at least two of these and/or alloys of at least two thereof) nanocrystal dispersion composition with a loading in the range of 5 to 10 weight %, or 10 to 20 weight %, or 20 to 30 weight %, or 30 to 40 weight %, or 40 to 50 weight %, or 50 to 60 weight %, or 60 to 70 weight %, or 70 to 80 weight %, or 80 to 90 weight %; and wherein the percent total transmittance after 6 months of shelf life, or 12 months of shelf life, or 18 months of shelf life, or 24 months of shelf life, or 30 months of shelf life when stored in a temperature range of 3° C.-10° C. or 10° C.-25° C. decreases by 0%-5%, or by 5%-10%, or by 10%-15%, or by 15%-20%, or by 20%-25%, or by 25%-30%, or by 30%-35%, or by 35%-40%, or by 40%-45%, or by 45%-50%, or 50%-55%, or 55%-60% of the original total transmittance as measured in a 1 cm cuvette wavelength of 300 nm, or 350 nm, or 400 nm, or 450 nm. For this example, the decrease in total transmittance is an absolute measure, so for example, if the initial normal transmittance is 80% and it decreases by 30% the total transmittance is then 50%.

The present disclosure provides at least partially capped nanocrystals, the nanocrystals being at least partially capped with at least one silicone capping agent containing a head group and a tail group wherein the head group anchors the at least one capping agent to a surface of the nanocrystals through a covalent bond through an M-O-M' linkage, wherein one of M and M' is a metal and the other of M and M' is silicon.

The at least partially capped nanocrystals of the present disclosure may be nanocrystals containing zirconia.

The at least partially capped nanocrystals of the present disclosure, such as optionally containing zirconia, may contain a tail group containing the following formula (I)

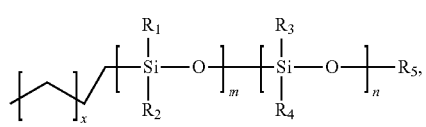

(I)

wherein x is 0-4, $R_1$, $R_2$, $R_3$, and $R_4$, are, independently, hydrogen, alkyl, aryl, poly aryl, alkenyl, alkynyl, epoxy, acrylate or combinations thereof, $R_1$, $R_2$, $R_3$, and $R_4$ may have an arrangement to form alternating, random, or block polymers and may include non-functional silicone chains and/or silicone side-chains comprising functional groups, $R_5$ is a group selected from $Si(CH_3)_3$, $Si(CH_3)_2H$, $Si(CH_3)_2$ (CHCH$_2$), or $Si(CH_3)_2(C_4H_9)$ and m and n are, independently, in the range of 0 to 60, such that m and n are not both zero.

The at least partially capped nanocrystals of the present disclosure, such as containing a tail group of the following general formula (I)

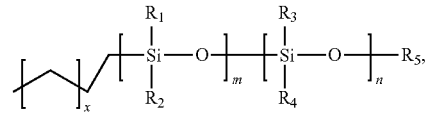

may contain functional groups of the silicone side-chains selected from H, an alkyl group, an aryl group, a polyaryl group, a vinyl group, an allyl group, an epoxy group, an acrylate group or combinations thereof.

The at least partially capped nanocrystals of the present disclosure may additionally and/or optionally be at least partially capped with at least one non-silicone containing capping agent.

The at least partially capped nanocrystals of the present disclosure may additionally and/or optionally be at least partially capped with at least one non-silicone capping agent containing methyltrimethoxysilane, ethyltrimethoxysilane, propyltrimethoxysilane, propyltriethoxysilane, n-octyltrimethoxysilane, n-octyltriethoxysilane, n-dodecyltrimethoxysilane, n-dodecyltriethoxysilane, n-hexadecyltrimethoxysilane, octadecyltrimethoxysilane, phenyltrimethoxysilane, phenylethylphenyltrimethoxysilane, 2-[methoxy(polyethyleneoxy)propyl]-trimethoxysilane, methoxytri(ethyleneoxy)propyltrimethoxysilane, vinyltrimethoxysilane (VTMS), allyltrimethoxysilane (ATMS), 1-hexenyltrimethoxysilane, or 1-octenyltrimethoxysilane (OTMS).

The at least partially capped nanocrystals of the present disclosure may additionally and/or optionally be at least partially capped with at least one non-silicone capping agent is —$(CH_2)_a$—R' wherein a is 0-18 and R' is H, alkyl, alkenyl or alkynyl.

The present disclosure provides a solvent-free dispersion of at least partially capped nanocrystals, such as are described herein, in a low molecular weight silicone matrix, the at least one capping agent containing a silicone capping agent, the at least partially capped nanocrystals being present in the matrix in an amount of 50 weight percent to 60 weight percent of the dispersion, the dispersion having at least one of a normal transmittance of 25% to 90% when measured in a 1 cm cuvette at wavelengths of 500 nm and 600 nm, a diffuse transmittance of 25% to 75% when measured in a 1 cm cuvette at wavelengths of 500 nm and 600 nm or a total transmittance of 40% to 90% when measured in a 1 cm cuvette at wavelengths of 500 nm and 600 nm. Solvent-free dispersions of the present disclosure may have a refractive index in the range of 1.5 to 1.6 at a wavelength of 500 nm.

The present disclosure provides a solvent-free dispersion of at least partially capped nanocrystals and phosphor particles in a silicone matrix, the at least one capping agent containing a silicone capping agent, wherein the at least partially capped nanocrystals are at least partially capped nanocrystals of the present disclosure.

The present disclosure provides a nanocomposite containing a cured dispersion of the present disclosure.

The present disclosure provides an LED encapsulant containing a nanocomposite of the present disclosure.

The present disclosure provides a lens containing an encapsulant of the present disclosure.

The present disclosure provides a method of making at least partially capped nanocrystals of the present disclosure, the method including:
suspending synthesized nanocrystals in a non-polar solvent,
adding at least one silicone containing capping agent to form a mixture,
heating the mixture, optionally in the presence of at least one non-silicone capping agent and further optionally in the presence of water,
collecting said at least partially capped nanocrystals.

The present disclosure provides a method of making at least partially capped nanocrystals of the present disclosure, the method including:
suspending synthesized nanocrystals in a non-polar solvent,
adding at least one silicone containing capping agent to form a mixture,
heating the mixture, in the presence of said at least one non-silicone capping agent, and optionally in the presence of water,
collecting the at least partially capped nanocrystals.

The present disclosure provides a method of making solvent free dispersion of the present disclosure, the method including:
dispersing the at least partially capped nanocrystals of the present disclosure in a silicone matrix, optionally including or containing a vinyl containing silicone and/or a hydride containing silicone, having a weight average molecular weight of 100 to 100,000 Da, or optionally 100 to 1000 Da.

The present disclosure provides a method of making solvent free dispersion of the present disclosure, the method including:
dispersing at least partially capped nanocrystals of the present disclosure in a solvent with a silicone matrix, optionally including or containing a vinyl containing silicone and/or a hydride containing silicone, having a weight average molecular weight of 100 to 100,000 Da, or optionally 100 to 1000 Da, and
removing said solvent to produce the solvent free dispersion.

All references listed and described herein are incorporated herein by reference.

We claim:

1. A solvent-free dispersion comprising:
a silicone matrix, and
nanocrystals at least partially capped with at least one capping agent in the silicone matrix, wherein
the at least one capping agent comprises a silicone capping agent, and wherein
a sample of the dispersion containing 50-60 wt. % of the at least partially capped nanocrystals has a normal transmittance ($T_n$) of 50% to 90% when measured in a 1 cm cuvette at wavelengths of 450 nm, 500 nm, 550 nm or 600 nm, wherein
the at least partially capped nanocrystals are optionally at least partially capped with at least one silicone capping agent comprising a head group and a tail group wherein the head group anchors the at least one capping agent to a surface of the nanocrystals through a covalent bond through an M-O-M' linkage, where one of M and M' is a metal and the other of M and M' is silicon.

2. The solvent-free dispersion of claim 1, wherein the dispersion has a refractive index in the range of 1.5 to 1.6 at a wavelength of 500 nm.

3. The solvent-free dispersion of claim 1, wherein the nanocrystals comprise zirconia.

4. The solvent-free dispersion of claim 3, wherein the dispersion has a refractive index in the range of 1.5 to 1.6 at a wavelength of 500 nm.

5. The solvent-free dispersion of claim 1, wherein the tail group comprises the following formula (I)

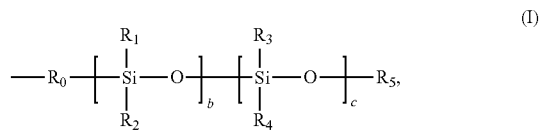

wherein
$R_0$, when present, is $C_{1-8}$ alkyl, $R_1$, $R_2$, $R_3$, and $R_4$, are, independently, hydrogen, alkyl, aryl, polyaryl, alkenyl, alkynyl, epoxy, acrylate or combinations thereof, $R_1$, $R_2$, $R_3$, and $R_4$ may have an arrangement to form alternating, random, or block polymers and may include non-functional silicone chains and/or silicone side-chains comprising functional groups, $R_5$ is a group selected from $Si(CH_3)_3$, $Si(CH_3)_2H$, $Si(CH_3)_2(CHCH_2)$, or $Si(CH_3)_2(C_4H_9)$ and b and c are, independently, in the range of 0 to 60, such that b and c are not both zero, said functional groups optionally being selected from H, an alkyl group, an aryl group, a polyaryl group, a vinyl group, an allyl group, an epoxy group, an acrylate group or combinations thereof.

6. The solvent-free dispersion of claim 1, wherein the nanocrystals are at least partially capped with at least one non-silicone containing capping agent.

7. The solvent-free dispersion of claim 6, wherein the at least one non-silicone capping agent is methyltrimethoxysilane, ethyltrimethoxysilane, propyltrimethoxysilane, propyltriethoxysilane, n-octyltrimethoxysilane, n-octyltriethoxysilane, n-dodecyltrimethoxysilane, n-dodecyltriethoxysilane, n-hexadecyltrimethoxysilane, octadecyltrimethoxysilane, phenyltrimethoxysilane, phenylethylphenyltrimethoxysilane, 2-[methoxy(polyethyleneoxy)propyl]-trimethoxysilane, methoxytri(ethyleneoxy)propyltrimethoxysilane, vinyltrimethoxysilane (VTMS), allyltrimethoxysilane (ATMS), 1-hexenyltrimethoxysilane, or 1-octenyltrimethoxysilane (OTMS).

8. The solvent-free dispersion of claim 6, wherein the at least one non-silicone capping agent is —$(CH_2)_a$—R' wherein a is 0-18 and R' is H, alkyl, alkenyl or alkynyl.

9. A nanocomposite comprising a cured dispersion of the solvent-free dispersion of claim 1.

10. An LED encapsulant comprising the nanocomposite of claim 9.

11. A method of making the solvent-free dispersion of claim 1, wherein the method comprises:
dispersing the at least partially capped nanocrystals in a silicone matrix having a weight average molecular weight of 100 to 100,000 Da, the silicone matrix optionally being a vinyl containing silicone or a hydride containing silicone.

12. The method of claim 11, wherein the silicone matrix has a weight average molecular weight of 100 to 1000 Da.

13. A method of making the solvent-free dispersion of claim 1, wherein the method comprises:
dispersing the at least partially capped nanocrystals in a solvent with a silicone matrix having a weight average molecular weight of 100 to 100,000 Da, and removing said solvent to produce said solvent-free dispersion, the silicone matrix optionally being a vinyl containing silicone or a hydride containing silicone.

14. The method of claim 13, wherein the silicone matrix has a weight average molecular weight of 100 to 1000 Da.

15. A lens comprising an LED encapsulant, wherein the LED encapsulate is comprised of the nanocomposite of claim 9.

* * * * *